US006699631B2

(12) United States Patent
Miyamoto et al.

(10) Patent No.: US 6,699,631 B2
(45) **Date of Patent: *Mar. 2, 2004**

(54) IMAGE FORMING APPARATUS, IMAGE FORMING METHOD, PROCESS CARTRIDGE, PHOTOCONDUCTOR AND METHOD OF PREPARING PHOTOCONDUCTOR

(75) Inventors: Yuka Miyamoto, Numazu (JP); Toshiyuki Kabata, Yokohama (JP); Tamotsu Aruga, Isehara (JP)

(73) Assignee: Ricoh Company, Ltd., Tokyo (JP)

( * ) Notice: Subject to any disclaimer, the term of this patent is extended or adjusted under 35 U.S.C. 154(b) by 54 days.

This patent is subject to a terminal disclaimer.

(21) Appl. No.: 10/077,756

(22) Filed: Feb. 20, 2002

(65) Prior Publication Data

US 2002/0160287 A1 Oct. 31, 2002

(30) Foreign Application Priority Data

Feb. 20, 2001 (JP) ....................................... 2001-043955
Feb. 14, 2002 (JP) ....................................... 2002-037416

(51) Int. Cl.$^7$ ............................ G03G 15/00; G03F 9/00
(52) U.S. Cl. ............................ 430/56; 430/30; 399/159
(58) Field of Search ...................... 430/56, 30; 399/159

(56) References Cited

U.S. PATENT DOCUMENTS

| | | | |
|---|---|---|---|
| 4,740,441 | A | 4/1988 | Otomura |
| 4,942,104 | A | 7/1990 | Kitajima et al. |
| 5,028,502 | A | 7/1991 | Yuh et al. |
| 5,100,453 | A | 3/1992 | Richards |
| 5,339,138 | A | 8/1994 | Mishima et al. |
| 5,411,827 | A | 5/1995 | Tamura et al. |
| 5,427,880 | A | 6/1995 | Tamura et al. |
| 5,436,092 | A | 7/1995 | Ohtsuka et al. |
| 5,496,671 | A | 3/1996 | Tamura et al. |
| 5,578,405 | A | 11/1996 | Ikegami et al. |
| 5,608,010 | A | 3/1997 | Tamura et al. |
| 5,670,284 | A | 9/1997 | Kishi et al. |
| 5,702,855 | A | 12/1997 | Ikegami et al. |
| 5,789,128 | A | 8/1998 | Adachi et al. |
| 5,834,145 | A | 11/1998 | Yoshinaga et al. |
| 5,846,680 | A | 12/1998 | Adachi et al. |
| 5,910,561 | A | 6/1999 | Adachi et al. |
| 5,928,828 | A | 7/1999 | Suzuki |
| 5,942,363 | A | 8/1999 | Tanaka et al. |

(List continued on next page.)

*Primary Examiner*—Mark A. Chapman
(74) *Attorney, Agent, or Firm*—Oblon, Spivak, McClelland, Maier & Neustadt, P.C.

(57) ABSTRACT

An image forming apparatus including a photoconductor, and an exposing device for irradiating a surface of the photoconductor imagewise with a coherent light to form an electrostatic latent image thereon. The surface of the photoconductor has such roughness as to provide I(S) of at least $3.0\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right)$$

wherein N is a number of samples obtained from a sectional curve of the surface of the photoconductor and is $2^p$ where p is an integer, Δt is a sampling interval, in μm, at which the N-number of the samples are sampled, x(t) is a height of the sectional curve, in μm, of a sample at a position t in the preset length, and n and m are integers. The sectional curve is as obtained by measuring a profile of the surface through a preset length N·Δt.

38 Claims, 7 Drawing Sheets

U.S. PATENT DOCUMENTS

| | | | | |
|---|---|---|---|---|
| 5,999,773 | A | | 12/1999 | Yasutomi et al. |
| 6,026,262 | A | | 2/2000 | Kinoshita et al. |
| 6,030,736 | A | | 2/2000 | Ikegami et al. |
| 6,069,224 | A | | 5/2000 | Adachi et al. |
| 6,136,483 | A | | 10/2000 | Suzuki et al. |
| 6,191,249 | B1 | | 2/2001 | Tanaka et al. |
| 6,249,304 | B1 | | 6/2001 | Sawayama et al. |
| 6,319,878 | B1 | | 11/2001 | Ina et al. |
| 6,322,940 | B1 | | 11/2001 | Nishigaki et al. |
| 6,326,112 | B1 | | 12/2001 | Tamura et al. |
| 6,366,751 | B1 | | 4/2002 | Shakuto et al. |
| 6,432,596 | B2 | | 8/2002 | Ikuno et al. |
| 6,444,387 | B2 | | 9/2002 | Ri et al. |
| 6,492,079 | B2 | | 12/2002 | Shimada et al. |
| 6,534,227 | B2 | * | 3/2003 | Kabata et al. ................ 430/30 |

* cited by examiner

IMAGE FORMING APPARATUS, IMAGE FORMING METHOD, PROCESS CARTRIDGE, PHOTOCONDUCTOR AND METHOD OF PREPARING PHOTOCONDUCTOR

BACKGROUND OF THE INVENTION

The present invention relates to a photoconductor, an image forming apparatus, an image forming method and a process cartridge using the same. The present invention is also directed to a method of preparing a photoconductor.

In recent years, with an increasing demand for reproduction of image information with a high definition, image forming with higher definition and resolution is highly required. In high resolution image forming, characteristics of a photoconductor are likely to be reflected in a formed image in addition to the image information itself. An image forming process employing coherent light such as laser beam for writing light is widely used in a field of electrophotography for forming a digital image, for example in copying machines, printers and facsimiles. In such a process, there tends to arise a problem of occurrence of interference fringes in a formed image due to interference of coherent light in a photoconductor.

It is known that when the photoconductor meets with the following relation:

$$2nd=m\lambda$$

(wherein n is a reflective index of a charge transporting layer, d is a thickness of the charge transporting layer, $\lambda$ is a wavelength of the writing light and m is an integer), the writing light is enhanced to cause interference fringes.

For example, when $\lambda$=780 nm and n=2.0, a set of interference fringes is generated every time the thickness of the charge transporting layer is changed by 0.195 $\mu$m. In order to eliminate such interference fringes completely, therefore, the charge transporting layer should have a thickness variation not greater than 0.195 $\mu$m all over the image forming area. However, it is very difficult to produce such a photoconductor for an economical reason. Thus, various methods for restraining interference fringes have been proposed.

For example, Japanese Laid-Open Patent Publication No. S57-165845 discloses a photoconductor having a charge generating layer containing amorphous Si, wherein a light absorbing layer is provided on a surface of an aluminum support to prevent mirror reflection of light on the surface of the support, thereby preventing occurrence of interference fringes. This method is effective to a photoconductor having a layer structure consisting of an aluminum support/a charge transporting layer/a charge generating layer such as an amorphous Si photoconductor but is not very effective to a photoconductor having a layer structure consisting of an aluminum support/a charge generating layer/a charge transporting layer as seen in many organic photoconductors.

Japanese Laid-Open Patent Publication No. H07-295269 discloses a photoconductor having a layer structure consisting of an aluminum support/an under coat layer/a charge generating layer/a charge transporting layer, wherein a light absorbing layer is provided on the aluminum support to prevent interference fringes. However, even with this photoconductor, it is impossible to prevent interference fringes completely.

Japanese Examined Patent Publication No. H07-27262 discloses an image forming apparatus having a photoconductor including a cylindrical support having a convex shape obtained by superimposing a sub-peak on a main peak in a cross-section cut along a plane including the central axis thereof, and an optical system for irradiating coherent light with a diameter smaller than one cycle of the main peak to the photoconductor. The image forming apparatus can restrain interference fringes to a large extent with some limited types of photoconductors. However, many of photoconductors including a support having a convex shape obtained by superimposing a sub-peak on a main peak in a cross-section cut along a plane including the central axis thereof still generate interference fringes.

A photoconductor including a support having a specified parameter of surface roughness is proposed (for example, Japanese Laid-Open Patent Publication No. H10-301311). The photoconductor can restrain interference fringes when used in an image forming apparatus having a low resolution. However, in the case of an image forming apparatus having a high resolution, it is impossible to determine conditions to eliminate interference fringes completely even though the surface roughness of the support is specified with conventionally used parameters (maximum height roughness (Ry), ten point-average roughness (Rz), center line-average roughness (Ra) etc.).

A photoconductor in which surface roughness of an intermediate layer and surface roughness of an outermost layer are specified in addition to surface roughness of a support is also known. For example, Japanese Laid-Open Patent Publication No. H6-138685 discloses a photoconductor including a conductive support having an Rz of 0.01–0.5 $\mu$m and a surface protective layer having an Rz of 0.2–1.2 $\mu$m. However, a surface protective layer is generally poor in hole transferring ability so that the photoconductor tends to cause a problem of an increase in electric potential of a latent image and to produce an unclear image by influences of ion species generated by electrification, oxidizing or reducing gas, humidity and so on. Also, it is extremely difficult to specify an Rz to eliminate interference fringes completely. When the writing light of the image forming apparatus has a high resolution, image defects such as interference fringes tends to occur.

Japanese Laid-Open Patent Publication No. H7-13379 discloses a photoconductor including an intermediate layer having an Rz of not greater than 1.0 $\mu$m and a surface protective layer having an Rz of not greater than 1.0 $\mu$m, for the purpose of preventing interference fringes such as moire. It is thought to be effective to provide the surfaces of the layers with roughness in a certain degree or greater. However, an upper limit of the Rz for each layer is disclosed but an Rz necessary to prevent interference fringes such as moire is not disclosed.

Japanese Laid-Open Patent Publication No. H08-248663 discloses a photoconductor including a support having a surface roughness of 0.01 to 2.0 $\mu$m, an outermost layer having a surface roughness of 0.1 to 0.5 $\mu$m and containing inorganic particles having an average particle diameter of 0.05–0.5 $\mu$m. However, it is not specified what kind of surface roughness is the surface roughness of the support and the outermost layer. As mentioned above, conventional parameters of surface roughness include Ry, Rz and Ra. It is well known that even if one solid surface is measured for the surface roughness, the measurements are largely varied depending upon the parameters and upon the measurement conditions such as measurement length. Even if the roughness of the support and the outermost layer is Rz provided in JIS and so on, there are many cases where interference fringes cannot be prevented completely.

As mentioned above, conditions to prevent interference fringes completely are unknown but interference fringes are frequently reduced when a support, an intermediate layer or an outermost layer has a roughened surface. However, it is impossible to obtain a photoconductor capable of preventing interference fringes completely even if surface conditions of a support, undercoat layer (intermediate layer) and an outermost layer of a photoconductor are specified with conventionally used parameters of surface roughness, and this tendency increases as the resolution of a printed image becomes higher.

SUMMARY OF THE INVENTION

It is, therefore, an object of the present invention to provide an image forming apparatus which has overcome the problems of the prior arts.

Another object of the present invention is to provide an image forming apparatus of the above-mentioned type which is capable of producing a high-quality image free from image defects such as interference fringes, streaks, and black spots.

It is a further object of the present invention to provide an image forming apparatus capable of producing a high-quality image free from image defects such as blur without lowering the resolution of an output image.

It is a further object of the present invention to provide an image forming apparatus capable of producing a high-quality image free from image defects such as white voids, non-uniformity, discharge breakdown and interference fringes.

It is a further object of the present invention to provide an image forming apparatus in which surface conditions of a photoconductor are hardly changed even though image forming is repeated and thus no potential variation of a latent image caused by nonuniformity in electrification and sensitivity is generated and which can produce a high-quality image free from image defects such as interference fringes and black spots caused by discharge breakdown.

It is yet a further object of the present invention to provide a photoconductor capable of producing a high-quality image free from image defects such as interference fringes.

It is a further object of the present invention to provide a process cartridge having mounted thereon the above photoconductor.

It is a further object of the present invention to provide a method of preparing a photoconductor capable of producing a high-quality image free from image defects such as interference fringes.

In accordance with one aspect of the present invention, there is provided an image forming apparatus comprising a photoconductor having a photoconductive layer provided on a support, and an exposing device for irradiating a surface of said photoconductor imagewise with a coherent light to form an electrostatic latent image thereon, the surface of said photoconductor having such characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

-continued $$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

- N is a number of samples obtained from a sectional curve of the surface of the photoconductor and is $2^p$ where p is an integer,
- $\Delta t$ is a sampling interval, in $\mu$m, at which the N-number of the samples are sampled, said sectional curve being obtained by measuring a profile of the surface through a preset length $N\cdot\Delta t$,
- x(t) is a height of the sectional curve, in $\mu$m, of a sample at a position t in said preset length, and
- n and m are integers.

In another aspect, the present invention provides an image forming method wherein a coherent light is irradiated on a photoconductor having a photoconductive layer provided on a support to form an electrostatic latent image thereon, the surface of said photoconductor having such characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

- N is a number of samples obtained from a sectional curve of the surface of the photoconductor and is $2^p$ where p is an integer,
- $\Delta t$ is a sampling interval, in $\mu$m, at which the N-number of the samples are sampled, said sectional curve being obtained by measuring a profile of the surface through a preset length $N\cdot\Delta t$,
- x(t) is a height of the sectional curve, in $\mu$m, of a sample at a position t in said preset length, and
- n and m are integers.

The present invention further provides a photoconductor comprising a support, and a photoconductive layer provided on said support, said photoconductor having such surface characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

- N is a number of samples obtained from a sectional curve of the surface of the photoconductor and is $2^p$ where p is an integer,
- $\Delta t$ is a sampling interval, in $\mu$m, at which the N-number of the samples are sampled, said sectional curve being obtained by measuring a profile of the surface through a preset length N·Δt, x(t) is a height of the sectional curve, in μm, of a sample at a position t in said preset length, and n and m are integers.

The present invention further provides a process cartridge freely detachable from an image forming apparatus, comprising the above photoconductor, and at least one means selected from the group consisting of charging means, image exposure means having a coherent light source, developing means, image transfer means, and cleaning means.

The present invention further provides a method of producing a photoconductor comprising forming a photoconductive layer on a support such that said photoconductor has surface characteristics providing I(S) of at least $3.0\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of the photoconductor and is $2^p$ where p is an integer, Δt is a sampling interval, in μm, at which the N-number of the samples are sampled, said sectional curve being obtained by measuring a profile of the surface through a preset length N·Δt, x(t) is a height of the sectional curve, in μm, of a sample at a position t in said preset length, and n and m are integers.

The present inventors thought that when very minute interference fringes invisible with naked eyes are positively formed, the interference fringes are not visually recognized as a whole, and that interference fringes may be prevented when minute unevenness is provided on a surface of a photoconductor. However, when various photoconductors having a roughened surface were measured for the surface roughness thereof using the conventional parameters of surface roughness such as Rz, surface roughness having an effect of preventing interference fringe was not able to be specified.

For the purpose of properly specifying surface conditions of a photoconductor-to prevent interference fringes, the present inventors carefully observed sectional curves of photoconductors and found that a sectional curve of a surface of a photoconductor consists of a multiplicity of waves (of different wavelengths and amplitudes) and that waves having relatively small amplitudes as well as waves having large amplitudes largely influence the occurrence of interference fringes. Of the conventional parameters of surface roughness, Ry, which is a difference in height between the highest peak and the deepest valley of a measured sectional curve, cannot extract information of minute unevenness. Rz, which is a difference between an average of the height of the five highest peaks and an average of the depth of the five deepest valleys, is frequently used as a parameter representing an average unevenness of a sectional curve. However, when the number of waves consisting of a sectional curve is very large, the number of extracted waves is excessively small with the five highest peaks and the five deepest valleys, so that Rz cannot properly represent the sectional curve. Ra can properly represent magnitude of average unevenness of a sectional curve composed of only waves with large amplitudes. However, minute waves superimposed on waves with large amplitudes are cancelled in calculating Ra and thus are not reflected in Ra at all. Thus, Ra cannot properly express a sectional curve. As above, the conventional parameters express a sectional curve focusing on waves with large amplitudes without any consideration of minute waves with small amplitudes and thus cannot specify surface conditions of a photoconductor to prevent interference fringes.

The present inventors has found that it is necessary to make all the waves constituting the sectional curve of a photoconductor have a predetermined strength (power) or greater in order to attain such surface conditions of a photoconductor as to prevent interference fringes, and has accomplished the present invention.

The fact that the strength of all the waves is strong means that the entire surface of the photoconductor is largely undulated, namely sufficiently roughened. Then, intervals between interference fringes in an image can be too small to be recognized with naked eyes.

BRIEF DESCRIPTION OF DRAWINGS

Other objects, features and advantages of the present invention will become apparent from the detailed description of the preferred embodiments of the invention which follows, when considered in the light of the accompanying drawings, in which.

DETAILED DESCRIPTION OF PREFERRED EMBODIMENT OF THE INVENTION

An image forming apparatus according to the present invention comprises a photoconductor and an exposing device for irradiating a surface of the photoconductor imagewise with a coherent light to form an electrostatic latent image thereon. The photoconductor comprises a support and a photoconductive layer provided on the support and including at least a charge generating material and a charge transporting material. The photoconductor may further comprise an under-coating layer, when desired.

Figure 8:
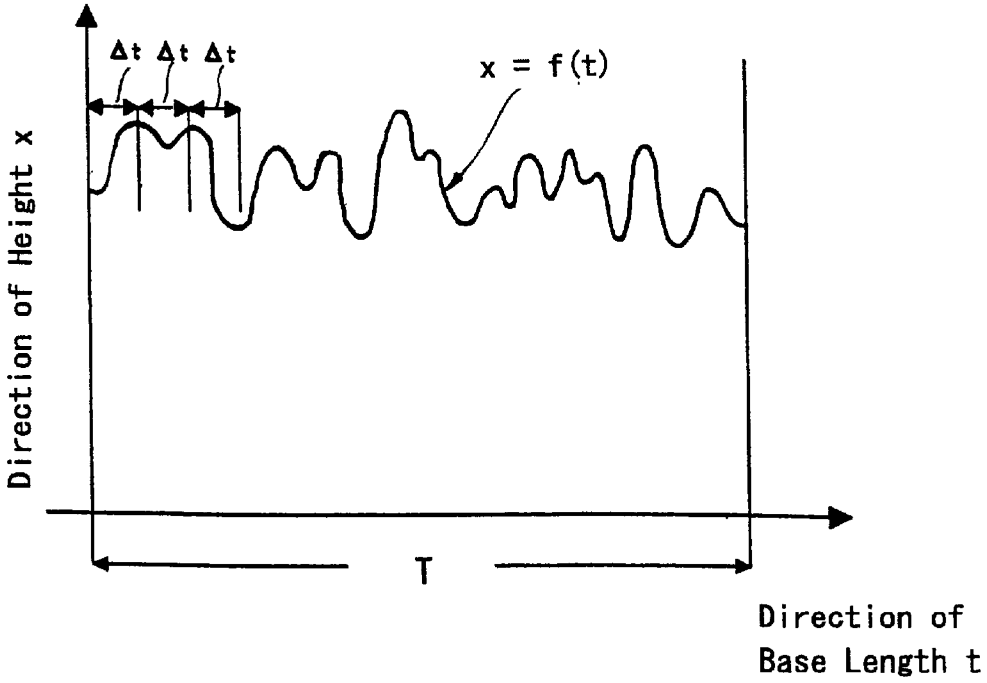
FIG. 8 is a schematic illustration of a sectional curve of a surface of a photoconductor.
Figure 9:
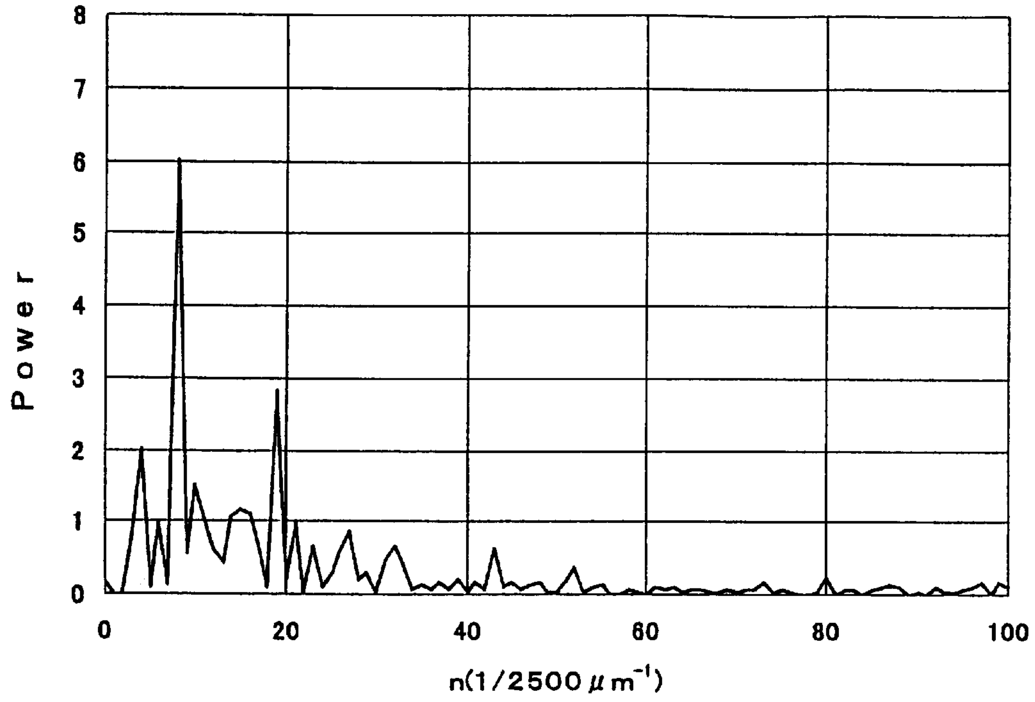
FIG. 9 shows a power spectrum of a sectional curve of a surface of a photoconductor obtained in Example 18.

The photoconductor has such surface characteristics as to provide I(S) of at least $3.0\times10^{-3}$, wherein I(S) is obtained by discrete Fourier transformation of a data group of heights x(t) [$\mu$m] of a sectional curve of the surface of the photoconductor obtained by measuring a profile of the surface through a preset length. The data group is obtained by sampling N-number of samples of the sectional curve in a length T as shown in FIG. 8 at a sampling interval of $\Delta$t [$\mu$m] in a direction of the base length t of the sectional curve. The base length t extends along the x-axis direction, while the direction of height x(t) of the sectional curve is in parallel with the y-axis. The height t(x) of the sectional curve is a relative amount with reference to an arbitrary base such as a height at the initial point at the start of the measurement or a height at the midpoint (T/2) of the sampling length T. The direction of the base length is a direction of an intersection between a plane of the surface to be measured and a plane in which the surface is cut for obtaining the sectional curve of the surface.

The discrete Fourier transformation is in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are integers and $N=2^P$, p is an integer. I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

As a method of measuring a sectional curve of a surface of the photoconductor in the present invention, any conventional method such as an optical method, an electrical method, an electrochemical method and a physical method can be employed as long as it has high reproducibility, measurement accuracy and simplicity. Among those, an optical method or a physical method is preferred because of its simplicity, and especially, a physical method using a tracer is preferred most because of its high reproducibility and accuracy.

The sampling may be conducted in any direction but is generally conducted in a main scanning direction of writing light for image formation or the sub-scanning direction. In the case of a drum-shaped photoconductor, a main scanning direction (longitudinal direction) is preferably used.

The I(S), which relates a total energy of variation in a power spectrum of the sectional curve, is at least $3.0\times10^{-3}$, preferably at least $5.0\times10^{-3}$, more preferably at least $6.0\times10^{-3}$. When the I(S) is less than $3.0\times10^{-3}$, the energy of the waves of the entire surface is so weak that interference fringes tend to be conspicuous in a printed image. For the purpose of preventing interference fringes, the larger I(s), the better. However, the upper limit of I(S) is generally $150.0\times10^{-3}$, preferably $100.0\times10^{-3}$, more preferably $60.0\times10^{-3}$, for reasons of prevention of image defects other than interference fringes, such as black spots and streaks, although the upper limit depends on the type of the image forming apparatus.

When the base length of the sectional curve of the photoconductor surface is designated as t [$\mu$m], the height (amplitude) x(t) [$\mu$m] of the curve is an irregular fluctuation quantity. Any irregular fluctuation can be obtained by combining sinusoidal fluctuations with various frequencies with proper phase and amplitude. Namely, it can be expressed by Fourier transform.

$$x(t)=\int_{-\infty}^{\infty}X(k)\exp(i2\pi kt)\,dk$$

$$X(k)=\int_{-\infty}^{\infty}x(t)\exp(-i2\pi kt)\,dt$$

wherein k is a wave number [$\mu m^{-1}$; the number of waves per $\mu$m]. A Fourier component X(k) represents a wave number k [namely, an amplitude of a wave with a wave length $\lambda=1/k$ [$\mu$m]] included in the irregular fluctuation quantity x(t). $|X(k)|^2$ represents energy of a component wave with a wave number k.

Consideration will be next made of distribution relation (spectrum) between the wave number k and the energy $|X(k)|^2$ of a component wave having the wave number k. S(k) is an average energy of the component wave having a wave number k of a sectional curve per unit section [1 $\mu$m], and defined as a power spectrum.

$$S(k)=\lim_{T\to\infty}\left[\frac{1}{T}|X(k)|^2\right]$$

In practice, however, the height x(t) of the sectional curve cannot be defined in a region of $-\infty<t<\infty$ but the measurement thereof is conducted in a part of a sectional curve, namely in a region of $-T/2\leqq t\leqq T/2$, wherein T is a length of the measured section. Thus, when the S(k) is calculated not by taking the limit as $T\to\infty$ but from the equation:

$$S(k)=\frac{1}{T}|X(k)|^2$$

30 using a T which is sufficiently large to such an extent that an average with respect to a wavelength of 1/k has a meaning as a microscope physical quantity, the result is substantially the same as the value obtained by taking the limit as $T\to\infty$.

As the Fourier transform employed herein is a discrete Fourier transform, the following alternation is conducted.

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are integers, N is the number of sampled points and represented by $N=2^P$, and $\Delta$t [$\mu$m] is a sampling interval and has a relation represented by $T/\Delta t=N$.)

When the measuring length T of the sectional curve is excessively short, the number of waves involved in the transform is so small that the error may be large or waves to be existed may fail to be evaluated. The measuring range T can be properly determined according to the values of $\Delta$t and N. In the case of the photoconductor for use in the image forming apparatus of the present invention, $\Delta$t is generally 0.01 to 50.00 $\mu$m, preferably 0.05 to 40.00 $\mu$m, more preferably 0.10 to 30.00 $\mu$m. The smaller $\Delta$t is, the more accurately the sectional curve can be reproduced. However, when $\Delta$t is less than 0.01 $\mu$m, a huge number of sampling points are necessary to make the measuring region T sufficiently large so that all the waves consisting of the sectional curve may be sampled. This increases the burden of calculation and results in decrease of the measuring range T. An amount of $\Delta$t less than 50 $\mu$m is desired for reasons of extraction of a large number of waves that are concerned with the characteristics of the photoconductor.

The more the sampling number N, the better, if the burden of calculation is not taken into consideration. Practically, it is at least 2048, preferably at least 4096, more preferably at least 8192 in order to decrease the error.

It has been confirmed that when the sampling interval Δt is, for example, 0.31 [μm], the power spectrum sufficiently converges when N is 4096.

Specifically, the calculation of a power spectrum using the discrete Fourier transform is carried out with the following equation:

$$S\left(\frac{n}{N\cdot\Delta t}\right)=\frac{1}{N}\cdot\left|X\left(\frac{n}{N\cdot\Delta t}\right)\right|^2$$

An integral value represented by:

$$\sum_{n=0}^{N-1}\left\{S\left(\frac{n}{N\cdot\Delta t}\right)\right\}$$

represents a total energy of the measured sectional curve. However, the value varies depending upon measurement conditions. Thus, I(S) standardized by N can be employed as a universal parameter. Namely, I(S) can be calculated from the equation:

$$I(S)=\left(\frac{1}{N}\right)\sum_{n=0}^{N-1}\left\{S\left(\frac{n}{N\cdot\Delta t}\right)\right\}$$

It has been confirmed that the integral value also converges within a few percent error when N=4096 and Δt=0.31 [μm].

From a different point of view, a sampling interval for surface roughness of a photoconductor (real space) is Δt [μm], while a sampling interval for power spectrum (inverse space) is Δn=1/(N·Δt) [$\mu m^{-1}$]. This is because the domain of the height x(t) of the sectional curve is for a section T=N×Δt. This means that the original signal x(t) is reproduced by a Fourier spectrum of sample values obtained in the inverse space at an interval of Δt=1/(N·Δt). The variation period of a sectional curve which can be reproduced herein is about 2Δt, [according to Shannon sampling theorem]. As for the phenomenon examined now, surface roughness over this degree is involved, so that the sampling interval Δt=0.31 μm is sufficient. In same cases, however, variations with shorter periods must be taken into consideration. In such a case, it is only necessary that the sampling intervals should be shorter as appropriate.

As described before, the sectional curve of a surface of the photoconductor for use in the image forming apparatus of the present invention consists of a large number of waves. Waves with a wavelength of 250 μm or shorter has a large effect on preventing interference fringes, although the energy of the waves is weak. On the other hand, waves with a wavelength of over 250 μm have an effect of preventing interference fringes but cause image defects such as streaks when having excessively large energy. Thus, a ratio I'(S), which is a value for waves with a wavelength of not greater than 250 μm, to I(S), which is a value for all the waves, is 0.35 or less, preferably 0.30 or less, more preferably 0.25 or less.

$$I(S)=\left(\frac{1}{N}\right)\sum_{n=0}^{N-1}\left\{S\left(\frac{n}{N\cdot\Delta t}\right)\right\}$$

$$I'(S)=\left(\frac{1}{N}\right)\sum_{n=0}^{n'}\left\{S\left(\frac{n}{N\cdot\Delta t}\right)\right\}$$

wherein n' is the maximum integer satisfying n'/(N·Δt)≦1/250.

Methods for controlling the surface condition of the photoconductor for use in the image forming apparatus of the present invention include physical processing such as processing with an abrasive, an abrasive paper (tape), a grinder (a buffing machine or a sand blast); chemical or electrochemical surface roughening; surface roughening utilizing heat, such as heat ray irradiation, pressing of a heated photoconductor onto a mold having a roughened surface or pressing a heated mold having a roughened surface onto a photoconductor; a method in which the conditions at the time of producing the photoconductor, such as temperature and humidity, are controlled; and a method in which a layer containing particles is formed such that the particles are exposed from the surface thereof.

Above all, a mechanical or physical processing method and a method in which particles are exposed from the photoconductor surface are preferred for reasons of productivity and reproducibility. Especially, the method in which particles are exposed from the photoconductor surface can accomplish a properly roughened, ideal surface condition with high reproducibility. The particles for use in this method generally have a diameter of 0.01 to 1.00 μm, preferably 0.05 to 0.80 μm, more preferably 0.10 to 0.60 μm. A diameter of no more than 1.00 μm is desired for reasons of prevention of undulation of the photoconductor surface and occurrence of white voids and non-uniformity in a printed image and discharge breakdown. A diameter or at least 0.01 μm is desirable for reasons of attaining proper roughness of the photoconductor surface the prevention of interference fringes. The particles contained in the surface layer of the photoconductor preferably have a refractive index 0.8 to 1.2 times, more preferably 0.85 to 1.15 times that of the charge transporting layer for reasons of good resolution of printed images.

Particles which hardly absorb writing light are preferably used. Examples of such particles include particles of fluoroplastics (e.g. polytetrafluoroethylene), silicone resins, phenol resins, carbonate resins; particles of above resins to which a charge transporting function is imparted; and particles of metal oxides, glass, i-carbon and diamond. Among those, particles of metal oxides such as titanium oxide, aluminum oxide, silicone oxide, tin oxide, iron oxide and zirconium oxide are preferred because these can appropriately realize a surface condition suitable for a photoconductor for use in the image forming apparatus of the present invention. Above all, aluminum oxide is preferred because it has a refractive index which is close to that of a charge transporting layer and is chemically stable. Especially, α-type aluminum oxide is most preferable because it can impart strength to the surface of the photoconductor.

Since aluminum oxide may be easily colored with a small amount of impurity and colored aluminum oxide may absorb writing light or may be lowered in hardness, aluminum oxide for use in the present invention has a purity of at least 3N, preferably at least 4N, more preferably at least 5N.

Although the particles may be applied onto a surface of a photoconductor by either a dry method or a wet method, a wet method, which is excellent in mass-productivity and with which the surface condition of the photoconductor can be easily controlled, is preferred. Thus, the particles can be applied by a method comprising steps of applying a resin solution containing the particles on a surface of the photoconductor and removing the solvent from the resin solution. The application of the resin solution may be performed by any conventional technique such as dip coating, ring coating, roll coating, die coating, blade coating or spray coating. Above all, spray coating, in which the coating liquid adheres in the form of droplets and the droplets are combined to form a film, is preferred for the purpose of moderately roughening the photoconductor surface.

The resin solution for use in application of the particles is not specifically limited as long as it has film forming properties and is capable of affording a film having sufficient strengths. It is preferred that the resin solution form a film having hole transferring ability for reasons of prevention of an increase of a potential of a latent image A coating liquid for forming a charge transporting layer, which will be described in detail hereinafter, may be more preferably used as the resin resolution.

The resin solution desirably contains a thickening agent or a thixotropic agent because metal oxide particles generally have a larger specific gravity than the resin resolution. When the resin solution contains a charge transporting material, a small amount of an acceptor material such as a weak acid may be added thereto for imparting thixotropy to the resin resolution and improving the dispersibility of the particles and the hole transferring ability of the film. Thereby, an increase of the potential of a latent image can be prevented.

The photoconductor used in the image forming apparatus according to the present invention comprises a support, on which an undercoat layer may be provided as desired, and a photoconductive layer including a charge generating material and a charge transporting material. A protective layer may be additionally provided on the photoconductive layer, if desired. The photoconductive layer may be a single layer containing both charge generating material and charge transporting material or may be separated into a charge generating layer containing a charge generating material and a charge transporting layer containing a charge transporting material.

The support of the photoconductor of the present invention may be a drum or a belt of a metal such as copper, aluminum, gold, silver, platinum, iron, palladium, nickel or an alloy thereof or a composite belt having a plastic sheet on which a layer of a metal, such as those described above, or a metal oxide, such as tin oxide or indium oxide, is provided by vacuum deposition or electroless plating. The support of the photoconductor for use in the image forming apparatus preferably has a surface processed by lamination of an undercoat layer, anodized-film formation, cutting, blasting, honing or the like in order to enhance adhesiveness to a photoconductive layer. The surface of the support is preferably roughened by controlling the composition or production conditions of the support or by a physical, chemical or electrochemical method in order to obtain the before-mentioned surface condition. Among those, a physical processing such as cutting and blasting is preferred because it has a high roughening effect.

The undercoat layer of the photoconductor may be a resin layer, a layer composed of a white pigment and a resin, or a metal oxide film obtained by chemically or electrically oxidizing a surface of a conductive support. Among those, a composition mainly composed of a white pigment and a resin is preferred. Examples of the white pigment include metal oxides such as titanium oxide, aluminum oxide, zirconium oxide and zinc oxide. Above all, titanium oxide, which is excellent in preventing injection of electrical charge from a conductive support, is most preferred. Examples of the resin for use in the undercoat layer include thermoplastic resins such as polyamide, polyvinyl alcohol, casein, methylcellulose; and thermosetting resins such as acrylic resins, phenol resins, melamine resins, alkyd resins, unsaturated polyethylene resins and epoxy resins. These resins may be used alone or in combination.

Examples of charge generating materials for use in the photoconductor include organic pigments and dyes such as mono azo pigments, bis azo pigments, tris azo pigments, tetrakis azo pigments, triarylmethane dyes, thiazine dyes, oxiazine dyes, xanthene dyes, cyanine dyes, styryl dyes, pyrylium dyes, quinacridone pigments, indigo pigments, perylene pigments, polycyclic quinon pigments, bisbenzimidazole pigments, indanthrene pigments, squalirium pigments, phthalocyanine pigments; and inorganic materials such as selenium, selenium-arsenic, selenium-tellurium, cadmium sulfide, zinc oxide, titanium oxide, amorphous silicone. The charge generating materials may be used alone or in combination.

Examples of charge transporting material include anthracene derivatives, pyrene derivatives, carbazole derivatives, tetrazole derivatives, metallocene derivatives, phenothiadine derivatives, pyrazoline compounds, hydrazone compounds, styryl compounds, styrylhydrazone compounds, enamine compounds, butadiene compounds, distyryl compounds, oxazole compounds, oxadiazole compounds, thiazol compounds, imidazole compounds, triphenylamine derivatives, phenylenediamine derivatives, aminostilbene derivatives and triphenylmethane. The charge transporting material may be used alone or in combination.

As a binder resin for use in formation of the charge generating layer and the charge transferring layer, any well-known thermoplastic resin, thermosetting resin, photosetting resin or photoconductive resin can be used as long as it is electrically nonconductive. Examples of the binder resin include thermoplastic resins such as polyvinyl chloride resins, polyvinylidene chloride resins, vinyl chloride-vinyl acetate copolymer resins, vinyl chloride-vinyl acetate-maleic anhydride terpolymer resins, ethylene-vinyl acetate copolymer resins, polyvinyl butyral resins, polyvinyl acetal resins, polyester resins, phenoxy resins, (metha)acrylic resins, polystyrene resins, polycarbonate resins, polyallylate resins, polysulfone resins, polyethersulfone resins, and ABS resins; thermosetting resins such as phenol resins, epoxy resins, urethane resins, melamine resins, isocyanate resins, alkyd resins, silicone resins, thermosetting acrylic resins; and photoconductive resins such as polyvinyl carbazole resins, polyvinyl anthracene resins, polyvinyl pyrene resins. The binder resins may be used alone or in combination, and are not limited to the above examples.

In the photoconductor of the present invention, a protective layer may be provided on the photoconductive layer. Examples of materials for use in formation of the protective layer include ABS resins, ACS resins, olefin-vinyl monomer copolymer resins, chlorinated polyether resins, aryl resins, phenol resins, polyacetal resins, polyamide resins, polyamide imide resins, polyacrylate resins, polyallyl sulfone resins, polybutylene resins, polybutylene terephthalate resins, polycarbonate resins, polyethersulfone resins, polyetylene terephthalate resins, polyimide resins, acrylic resins, polymethylpentene resins, polypropylene resins, polyphenylene oxide resins, polysulfone resins, polystyrene resins, polyalylate resin, AS resins, butadiene-styrene copolymer resins, polyurethane resins, polyvinyl chloride resins, polyvinylidene chloride resins and epoxy resins.

Since the photoconductor for use in the image forming apparatus of the present invention has an outwardly facing surface having roughness providing I(S) of at least $3.0\times10^{-3}$, an image formed therewith hardly has interference fringes. In order to eliminate interference fringes completely, the surface of the photoconductive layer on the side of the support (namely, the opposite side of the photoconductive layer from the outwardly facing surface of the photoconductor) should preferably have roughness in an appropriate condition. The surface of the photoconductive layer on the side of the support is referred to in the present specification and claims as "interface".

Thus, the interface of the photoconductive layer on the side of the support preferably has such surface characteristics as to provide I(S) of at least $1.5\times10^{-3}$, preferably at least $2.0\times10^{-3}$, more preferably at least $2.5\times10^{-3}$. I(S) is obtained by discrete Fourier transformation of a data group of heights x(t) [$\mu$m] of a sectional curve of the interface of the photoconductive layer. The data group is obtained by sampling N-number of samples of the sectional curve at a sampling interval of $\Delta t$ [$\mu$m] in a direction parallel to the base line of the sectional curve. The base line extends along the x-axis direction, while the height of the sectional curve is in parallel with the y-axis. The discrete Fourier transformation is in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are integers and $N=2^p$, p is an integer. I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

A value of I(S) of at least $1.5\times10^{-3}$ is desired for reasons of prevention of interference fringes. The larger the I(S), the better. However, when the I(S) is excessively large, the interface has a multiplicity of waves with large amplitudes like sharp protrusions, so that there tend to occur discharge breakdown due to short-circuit or aggregation of the material of the photoconductor around the sharp protrusions, which may cause image defects other than interference fringes. Thus, the upper limit of the I(S) is generally $100.0\times10^{-3}$, preferably $80.0\times10^{-3}$, more preferably $60.0\times10^{-3}$, although it depends on the image forming apparatus.

When the photoconductive layer is provided on an undercoat layer, the sectional curve of the interface of the photoconductor on the side of the support may be substituted by a sectional curve of the surface of the undercoat layer which constitutes the interface between the photoconductive layer and the undercoat layer, as long as the undercoat layer surface is not swollen or fused at the time of lamination of the photoconductive layer.

When the photoconductor for use in the image forming apparatus of the present invention has an undercoat layer interposed between a photoconductive layer and a support, the sectional curve of the interface of the photoconductor on the side of the support can be in an appropriate condition by controlling the sectional curve of a surface of the support on which the undercoat is provided. This is because many of waves with high power of waves constituting the sectional curve of the support are reflected in the interface of the photoconductive layer on the side of the support unless the undercoat layer has an excessively large thickness. Control of the sectional curve of the support is preferable because it is relatively easy and has high reproducibility.

Thus, the surface of the support on which the undercoat layer is provided preferably has such surface characteristics as to provide I(S) of at least $3.0\times10^{-3}$, preferably at least $5.0\times10^{-3}$, more preferably at least $6.0\times10^{-3}$. I(S) is obtained by discrete Fourier transformation of a data group of heights x(t) [$\mu$m] of a sectional curve of the surface of the support. The data group is obtained by sampling N-number of samples of the sectional curve at a sampling interval of $\Delta t$ [$\mu$m] in a direction parallel to the base line of the sectional curve. The base line extends along the x-axis direction, while the height of the sectional curve is in parallel with the y-axis. The discrete Fourier transformation is in accordance with the following formula:

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein n and m are integers and $N=2^p$, p is an integer. I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

An amount of I(S) of at least $3.0\times10^{-3}$ is desirable for reasons of obtaining a photoconductor surface from which particles are exposed, of satisfactory power of waves on the support surface and of prevention of interference fringes. The larger the I(S) of the sectional curve of the support surface, the better. However, when the I(S) is excessively large, the interface has a multiplicity of waves with large amplitudes like sharp protrusions, so that there tend to occur discharge breakdown due to short-circuit or aggregation of the material of the photoconductor around the sharp protrusions, which may cause image defects other than interference fringes. Thus, the upper limit of the I(S) is generally $150.0\times10^{-3}$, preferably $125.0\times10^{-3}$, more preferably $100.0\times10^{-3}$, although it depends on the image forming apparatus.

Measurement of a sectional curve of the interface of the photoconductive layer or the surface of the support may be conducted as in the case of the measurement of the sectional curve of the photoconductor surface. Any conventional method, such as an optical method, an electrical method, an electrochemical method and a physical method, can be employed as long as it has high reproducibility, measurement accuracy and simplicity. Among those, an optical method or physical method is preferred because of the simplicity thereof, and especially, and a physical method using a tracer is preferred most because of its high reproducibility and accuracy.

The thickness of the photoconductive layer of the photoconductor is properly determined according to the electrostatic characteristics and resolution required by the image forming apparatus and is generally 15 $\mu$m or less, preferably 5–14.5 $\mu$m. A photoconductor having a photoconductive layer with a thickness of less than 15 $\mu$m can attain high resolution but is apt to reflect its characteristics in a printed image. Thus, with a conventional photoconductor, streaks and interference fringes are apt to be generated. However, the photoconductor of the present invention hardly generates such defects.

Description will be next made of the image forming method and the image forming apparatus of the present invention in detail with reference to the accompanying drawings.

The image forming process and apparatus will be next described with reference to FIGS. 1 through 3.

Figure 1:
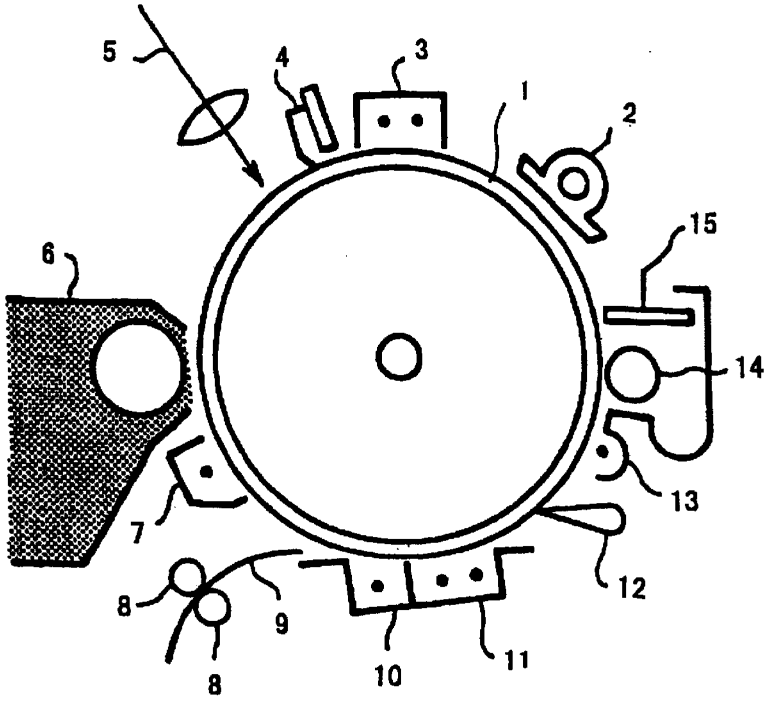
FIG. 1 is a schematic view showing an image forming apparatus according to the present invention.

Referring to FIG. 1, designated as 1 is an electrophotographic photoconductor in the form of a drum having an electroconductive support, and a photoconductive layer formed thereon. The photoconductor 1 may be in the form of a sheet or an endless belt, if desired. Disposed to surround the photoconductor 1 are a charger 3, an eraser 4, a light exposing unit 5, a development unit 6, a pre-transfer charger 7, an image transfer charger 10, a separating charger 11, a separator 12, a pre-cleaning charger 13, a fur brush 14, a cleaning blade 15, and a quenching lamp 2. In FIG. 1, reference numeral 8 indicates resist rollers.

The charger 3, the pre-transfer charger 7, the image transfer charger 10, the separating charger 11, and the pre-cleaning charger 13 may be conventional means such as a corotron charger, a scorotron charger, a solid state charger, and a charging roller. Each of the chargers as mentioned above can be arranged in contact with the photoconductor 1 or may be disposed with a gap being defined therebetween. In each charger, it is possible to superimpose an alternate current component to a direct current component. It is effective to employ both the image transfer charger 10 and the separating charger 11 together as illustrated in FIG. 1.

As the light source of the quenching lamp 2, there can be employed, for example, a fluorescent tube, tungsten lamp, halogen lamp, mercury vapor lamp, sodium lamp, light emitting diode (LED), semiconductor laser (LD) or electroluminescence (EL). As the light source of the light exposing unit 5, a coherent light source such as a semiconductor laser (LD) or a light emitting diode (LED) is used. Further, a desired wavelength can be obtained by use of various filters such as a sharp-cut filter, bandpass filter, a near infrared cut filter, dichroic filter, interference filter and color conversion filter. The photoconductor may be irradiated with light in the course of the image transfer step, quenching step, cleaning step, or pre-light exposure step.

The toner image formed on the photoconductor 1 using the development unit 6 is transferred to a transfer sheet 9. At the step of image transfer, all the toner particles deposited on the photoconductor 1 are not transferred to the transfer sheet 9. Some toner particles remain on the surface of the photoconductor 1. The remaining toner particles are removed from the photoconductor 1 using the fur brush 14 and the cleaning blade 15. The cleaning of the photoconductor may be carried out only by use of a cleaning brush. As the cleaning brush, there can be employed a conventional fur brush and magnetic fur brush.

When the photoconductor 31 is positively charged, and exposed to light images, positively-charged electrostatic latent images are formed on the photoconductor. In the similar manner as in above, when a negatively charged photoconductor is exposed to light images, negative electrostatic latent images are formed. A negatively-chargeable toner and a positively-chargeable toner are respectively used for development of the positive electrostatic images and the negative electrostatic images, thereby obtaining positive images. In contrast to this, when the positive electrostatic images and the negative electrostatic images are respectively developed using a positively-chargeable toner and a negatively-chargeable toner, negative images can be obtained on the surface of the photoconductor 1. Not only such development means, but also the quenching means may employ the conventional manner.

Figure 2:
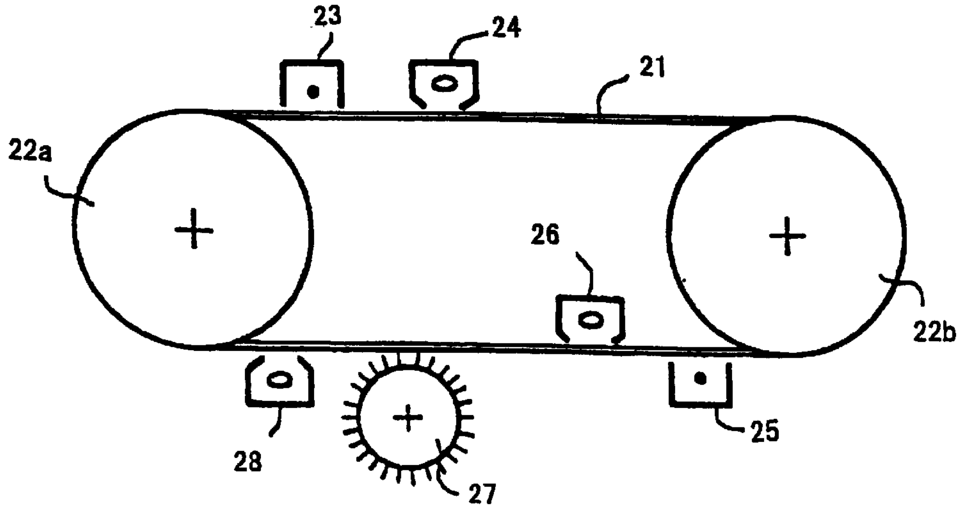
FIG. 2 is a schematic view showing another example of an image forming apparatus according to the present invention.
Figure 3:
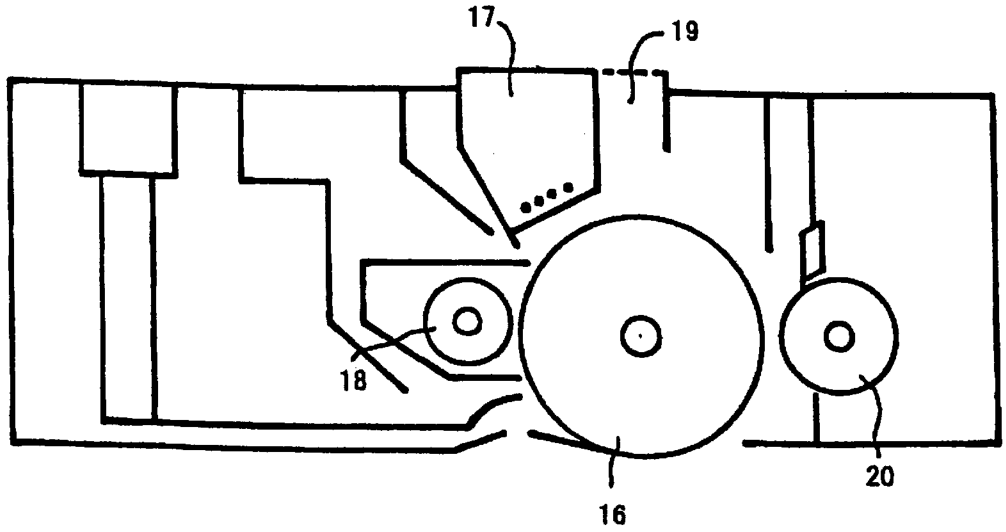
FIG. 3 is a schematic view showing an example of a process cartridge according to the present invention.

FIG. 2 is a schematic view which shows another example of the image forming apparatus according to the present invention. A photoconductor 21, which comprises an electroconductive support and a photoconductive layer formed thereon, is driven by driving rollers 22*a* and 22*b*. Charging of the photoconductor 21 is carried out by use of a charger 23, and the charged photoconductor 21 is exposed to light images using an image exposure light 24. Thereafter, latent electrostatic images formed on the photoconductor 21 are developed to toner images using a development unit (not shown), and the toner images are transferred to a transfer sheet with the aid of a transfer charger 25. After the toner images are transferred to the transfer sheet, the photoconductor 21 is subjected to pre-cleaning light exposure using a pre-cleaning light 26, and physically cleaned by use of a cleaning brush 27. Finally, quenching is carried out using a quenching lamp 28. In FIG. 2, the electroconductive support of the photoconductor 21 has light transmission properties, so that it is possible to apply the pre-cleaning light 26 to the electroconductive support side of the photoconductor 21.

The foregoing electrophotographic processes are merely illustrative of preferred embodiments of the present invention. Various modification and other embodiments may be used. For example, in the embodiment of FIG. 2, the photoconductive layer side of the photoconductor 21 may be exposed to the pre-cleaning light. Similarly, the image exposure light 24 and the quenching lamp 28 may be disposed so that light is directed toward the electroconductive support side of the photoconductor 21. While the photoconductor 21 is exposed to light using the image exposure light 24, pre-cleaning light 26, and the quenching lamp 28 in the embodiment of FIG. 2, light exposure for the photoconductor may be carried out by additionally providing any conventional exposing step such as exposure before image transfer or pre-exposure before the image exposure.

The above-discussed units, such as the charging unit, light-exposing unit, development unit, image transfer unit, cleaning unit, and quenching unit may be independently fixed in the copying machine, facsimile machine, or printer. Alternatively, at least one of those units may be incorporated in a process cartridge together with the photoconductor. To be more specific, the process cartridge is a single part or device which has the photoconductor and at least one of the charging unit, light-exposing unit, development unit, image transfer unit, cleaning unit and quenching unit and which is detachably set in the above-mentioned image forming apparatus. One example of the process cartridge according to the present invention is illustrated in FIG. 3. In this embodiment, designated as 16 is a photoconductor in the form of a drum comprising an electroconductive support and a charge generation layer. Disposed around the photoconductor 16 are a charger 17, a light exposing unit 19, a development roller 20 and a cleaning brush 18. The photoconductor 16 may be in the form of a sheet or an endless belt, if desired.

The wavelength of writing light for use in the image forming apparatus of the present invention is not specifically limited but is generally not grater than 700 nm, preferably not greater than 675 nm, more preferably 400 to 600 nm. The image forming apparatus of the present invention can produce an excellent image with a high resolution and high definition without generating image defects such as streaks and interference fringes even with writing light with a short wavelength of 600 nm or less, which can produce an output image with high resolution.

The method for reproducing gradation for use in the image forming apparatus of the present invention is not specifically limited. In a multi-level gradation reproducing system, density of pixels is set in a stepwise. Thus, an image forming apparatus employing a conventional photoconductor tends to generate interference fringes in a printed image, and the tendency is strong in an image forming apparatus employing a pulse width modulation system, a power modulation system or a system in which width modulation and power modulation are combined. However, the image forming apparatus of the present invention does not generate interference fringes even with a multi-level gradation reproducing system.

The resolution of an output image of the image forming apparatus of the present invention is not specifically limited. The image forming apparatus can produce a high-quality image when the resolution is 1000 dpi or higher, preferably 1200 dpi or higher.

In such an output image with a high resolution, the characteristics of the photoconductor tend to be reflected. Thus, an image forming apparatus employing a conventional photoconductor is apt to generate image defects such as streaks and interference fringes. However, the image forming apparatus of the present invention is free from such problems.

In order to restrain interference fringes, the photoconductor for use in the image forming apparatus of the present invention has surface characteristics providing I(S) of at least $3.0\times10^{-3}$. In general, the thickness of a photoconductor is gradually reduced by cleaning upon repeated image forming. However, the photoconductor surface should maintain the initial condition, namely at least the I(S) of a sectional curve of the photoconductor surface should be in a range shown in the present invention. Otherwise, printed image will cause interference fringes. In order to maintain the condition of the photoconductor surface, the decrease in the thickness of the photoconductor is desired to be not greater than 7%, preferably not greater than 5%, and more preferably not greater 3%, with respect to the initial thickness. A large decrease in thickness of the photoconductor may cause interference fringes, nonuniformity in latent image potential due to unevenness in electrification and sensitivity, and black spots due to discharge breakdown. In the case of a photoconductor having a photoconductive layer with a thickness of not greater than 15 $\mu$m which can attain high resolution, therefore, due consideration is desired to be made on the reduction of the thickness. In order to maintain the high resolution, the image forming apparatus is preferably equipped with a system for encouraging replacement of the photoconductor with a new one when the decrease in thickness of the photoconductor excesses 7% with respect to the initial thickness after a long-term use.

Examples of the method for maintaining the initial condition of the photoconductor surface include a method in which particles are exposed from the photoconductor surface and a method in which a protective layer is provided on the photoconductor surface. An image forming method without a cleaning blade such as in a cleanerless system and an image forming method in which image forming is conducted while a lubricating material is applied on the photoconductor surface are also effective. Especially, the method in which particles are exposed from the photoconductor surface and the method in which image forming is conducted while a lubricating material is applied on the photoconductor surface, or a combination thereof are preferred. As a method for maintain the I(S) of the sectional curve of the photoconductor surface within a range specified in the present invention, there is a method in which the photoconductor surface is forcibly ground with a blade, brush or the like to control the surface condition.

As the lubricating material for use in the method in which image forming is conducted while a lubricating material is applied on the photoconductor surface, a material which hardly absorbs writing light and easily becomes fine powder or forms a film so as not to interfere with image forming is preferably used. Examples of the lubricating material include fluoroplastics such as polytetrafluoroethylene, polyvinylidene fluoride and metallic soups of salts of a higher fatty acid with a metal other than alkali metals such as zinc and aluminum. Among those, metallic soaps and oils are preferred and, especially, zinc stearate is preferred because it is relatively easy to apply on the photoconductor surface in the shape of a film of fine particles.

Figure 4:
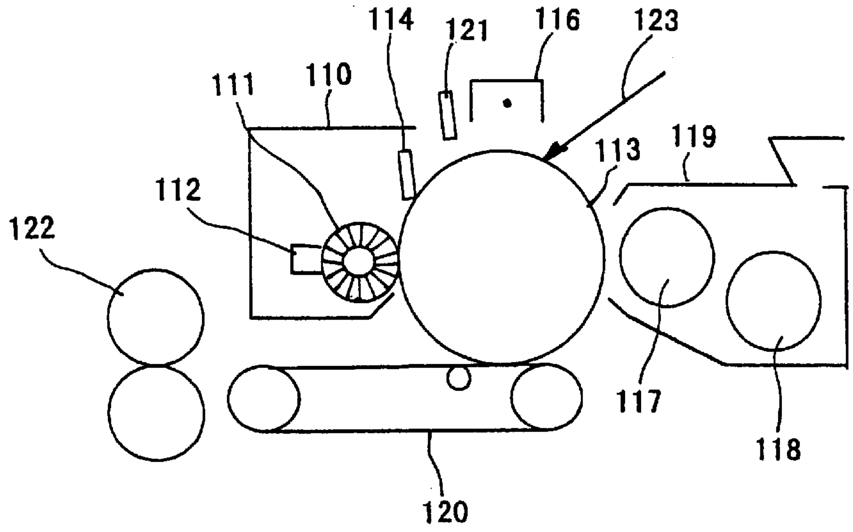
FIG. 4 is a schematic view showing an example of an image forming apparatus of the present invention provided with a lubricant applicator.

FIG. 4 shows an example of an image forming apparatus of the present invention, wherein a solid lubricant zinc stearate is used as a lubricating material. As shown in FIG. 4, a surface of a photoconductor 113 is uniformly charged by a charger 116 while the photoconductor 113 is rotated in the direction of the arrow. Then, the photoconductor 113 is irradiated with image light 123 by exposure means (not shown) at an exposure section provided downstream of the charger 116. Thereby, electric charges at portions where the image light 123 was irradiated were lost and a latent image corresponding to the image light 123 is formed on the surface of the photoconductor 113.

At a downstream of the exposure section, a developing unit 119 as developing means is disposed and a toner as a developer is contained in the developing unit. The toner is agitated and triboelectrified to desired polarity by an agitator 118 and then transported to a nip part (developing area) between a developing roller 117 and the photoconductor 113 by the developing roller 117. The toner transported to the developing area is transferred from the surface of the developing roller 117 to the surface of the photoconductor 113 by developing electric field formed in the developing area by developing bias applying means (not shown) and adheres to the surface of the photoconductor 113 to develop an electrostatic latent image on the photoconductor 113 into a toner image (visible image).

The toner image formed on the photoconductor 113 is transferred to a transfer paper as a transfer member fed to a transfer section by paper supply means (not shown) by a nip part (transfer section) between a transfer and transport belt 120 as transferring means disposed in the vicinity of the photoconductor 113 and the photoconductor 113. The toner image formed on the transfer paper is fixed by a fixing roller 122 as fixing means disposed downstream of the rotating direction of the transfer and transport belt 120. Then, the transfer paper is discharged onto a discharge tray outside the apparatus body by paper discharge means (not shown).

Toner which is not transferred to the transfer paper at the transfer section and remained on the photoconductor 113 (residual toner) is removed from the photoconductor 113 by a cleaning brush 111 and a cleaning blade 114 of a cleaning unit 110 as cleaning means disposed downstream of the rotating direction of the photoconductor 113 in the transfer section. Residual charge remained on the photoconductor 113 after the cleaning of the remaining toner is eliminated by a discharger 121 comprising a discharge lamp and so on.

Figure 5:
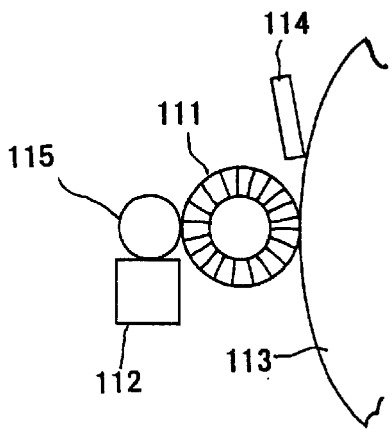
FIG. 5 is a fragmentary view showing the lubricant applicator of FIG. 4.

In such an image forming apparatus, it is effective to utilize the cleaning brush 111 of the cleaning unit 110 as zinc stearate applying means for applying zinc stearate to the surface of the photoconductor 113 in order to prevent enlargement of the apparatus and an increase in cost by providing the zinc stearate applying means. In the image forming apparatus of the present invention, a solid lubricant 112 of zinc stearate is provided in contact with the cleaning brush 111 of the cleaning unit 110 so that the zinc stearate may be applied to the surface of the photoconductor 113 by the cleaning brush 111. In the example shown in FIG. 4, a solid lubricant 112 is provided in direct contact with the cleaning brush 111. However, as shown in FIG. 5, the zinc stearate as the solid lubricant may be disposed in contact with an outer surface of an applying roller 115 disposed in contact with the cleaning brush 111 so that the zinc stearate may be supplied to the cleaning brush 111 via the applying roller 115.

In this image forming apparatus, a composition obtained by fusing and solidifying materials containing zinc stearate as a main component is used as a solid lubricant 112. The solid lubricant 112 is ground off as zinc stearate fine particles having a diameter of about 1 $\mu$m by brush fibers of the cleaning brush 111 and applied to the surface of the photoconductor 113 from the cleaning brush fibers. Thereafter, the fine particles of the solid lubricant 112 adhere to the photoconductor surface relatively strongly by an abutting pressure of the cleaning blade 114 onto the photoconductor 113. Considering developing efficiency, it is preferred that the amount of zinc stearate applied onto the photoconductor 113 be no larger than necessary.

Thus, this image forming apparatus is so constituted that the solid lubricant 112 is removable from the cleaning brush 111 by a removing mechanism (not shown) employing a solenoid. As the brush roller 111, a straight brush comprising 360 denier/24 filament carbon-containing acrylic fibers 124 and having a fiber density of 50000/in$^2$ and bristle length of about 5 mm. Use of a loop brush in which the brush fibers are loop-shaped as the cleaning brush 111 is not preferred because it grinds off the solid lubricant 112 excessively, so that too much zinc stearate is applied onto the photoconductor surface. The density and the thickness of the fibers of the cleaning brush 111 are so determined according to the linear velocity, diameter, material of the photoconductor and the materials of the solid lubricant 112 that the amount of zinc stearate is supplied to the photoconductor 113.

In order to form an image with high fidelity and high quality, the toner for use in the image forming apparatus of the present invention is desired to have an average particle size of not greater than 8 $\mu$m, preferably not greater than 7 $\mu$m, more preferably 1 to 6.5 $\mu$m. When the average particle size of the toner is not greater 8 $\mu$m, an image of excellent quality can be produced but the characteristics of the photoconductor are likely to be reflected in a printed image. Thus, an image produced with an image forming apparatus employing a conventional photoconductor is very apt to have interference fringes. However, an image produced with the image forming apparatus employing the photoconductor according to the present invention hardly has interference fringes.

The image forming apparatus of the present invention can produce a high-quality image free from interference fringes in single-color printing, multi-color printing and full-color printing. In color printing, it is required to reproduce an image with higher fidelity as compared with monochromatic printing. In color printing, an image is formed by superimposing color component images. Thus, when interference fringes occur, the characteristics of the photoconductor are superimposed on a printed image, causing a problem. However, the image forming apparatus employing the photoconductor according to the present invention can produce an image free from interference fringes also in color printing.

As a method of forming a color image using the image forming apparatus of the present invention, either a method comprising the steps of forming a plurality of images of different colors on photoconductors and transferring the toner images onto an output medium (a paper, in most cases) in succession, or a method comprising the steps of forming a plurality of images of different colors on photoconductors, laminating the toner images on a intermediate transfer member, and transferring the laminated toner image onto an output medium can be employed. However the image forming method using an intermediate transfer member, especially a method using an intermediate transfer belt as the intermediate transfer member, is preferred because it can provide improvement of image quality, prevention of color misalignment, enhancement of transfer efficiency and flexibility to output media when image density is high.

As the intermediate transfer belt, a belt made of fluoroplastics, a polycarbonate resin or a polyimide resin has been conventionally used but, in recent years, an elastic belt entirely of partially composed of an elastic material is spreading.

Transferring of a color image using a resin belt has a following problem. A color image is generally formed of four color toners. In one color image, first to fourth toner layers are formed. Since the toner layers receive pressure through a first transfer (transfer from a photoconductor to the intermediate transfer belt) and a secondary transfer (transfer from the intermediate transfer belt to a sheet), the aggregation force among toner particles is increased. When the aggregation force among toner particles is high, voids in letters and an edge void in a solid area are likely to occur.

A resin belt, which has high hardness and is not deformed according to toner layers, tends to compress toner layers and thus is likely to cause voids in letters. In recent years, a demand for printing on various types of paper such as a Japanese paper and a paper embossed on purpose is increasing. However, a paper of low smoothness is apt to have a gap between itself and the toner layers, so that an image printed thereon is likely to have a transfer void. When a transfer pressure in the secondary transfer process is increased to enhance the adhesion of toner to the paper, the aggregation force among toner particles is increased; causing voids in letters as above.

Thus, an elastic belt is suitable for the intermediate transfer belt. An elastic belt has lower hardness than a resin belt and thus is deformed according to toner layers and a paper of low smoothness in a transfer unit. Namely, the elastic belt is deformed following regional irregularity and enhances the adhesion of toners without unnecessarily increasing the transfer pressure onto the toner layers, so that an image with high uniformity and free from voids in letters can be produced even on a paper of low smoothness. When a toner image formed on the intermediate transfer belt has a thickness of over 30 $\mu$m, a printed image formed using an inelastic intermediate belt is likely to have white voids. However, an elastic intermediate transfer can produce a high-quality image free from such problems.

Examples of resins for use in production of the elastic belt include and are not limited to polycarbonate; fluororesin (ETFE, PVDF); styrene resins (homopolymers and copolymers containing styrene or a styrene homologue) such as polystyrene, chloropolystyrene, poly-$\alpha$-methylstyrene, styrene-butadiene copolymer, styrene-vinyl chloride copolymer, styrene-vinyl acetate copolymer, styrene-maleic acid copolymer, styrene-acrylic ester copolymers (styrene-methyl acrylate copolymer, styrene-ethyl acrylate copolymer, styrene-butyl acrylate copolymer, styrene-octyl acrylate copolymer and styrene-phenyl acrylate copolymer, etc.), styrene-methacrylic ester copolymers (styrene-methyl methacrylate copolymer, styrene-ethyl methacrylate copolymer, styrene-phenyl methacrylate copolymer, etc.), styrene-$\alpha$-methyl chloroacrylate copolymer, and styrene-acrylonitrile-acrylic ester copolymers; methyl methacrylate resins; butyl methacrylate resins; ethyl acrylate resins; butyl acrylate resins; modified acrylic resins (silicone-modified acrylic resin, vinyl chloride resins modified acrylic resins, acrylic-urethane resins, etc.); vinyl chloride resins, styrene-vinyl acetate copolymer, vinyl chloride-vinyl acetate copolymer, rosin-modified maleic acid resins, phenol resins, epoxy resins, polyester resins, polyester polyurethane resins, polyethylene, polypropylene, polybutadiene, polyvinylidene chloride, ionomer resins, polyurethane resins, silicone resins, ketone resins, ethylene-ethyl acrylate copolymer, xylene resins, polyvinyl butyral resins, polyamide resins, and modified polyphenylene oxide resins. The resins may be used alone or in combination.

Examples of rubbers and elastomers for use in the elastic belt include and are not limited to butyl rubber, fluoro rubbers, acrylic rubbers, EPDM, NBR, acrylonitrile-butadiene-styrene rubber natural rubber, isoprene rubber, styrene-butadiene rubber, butadiene rubber, ethylene-propylene rubber, ethylene-propylene terpolymers, chloroprene rubber, chlorosulfonated polyethylene, chlorinated polyethylene, urethane rubber, syndiotactic 1,2-polybutadiene, epichlorohydrin rubbers, silicone rubbers, fluororubbers, polysulfide rubbers, polynorbornene rubber, hydrogenated nitrile rubber, and thermoplastic elastomers (e.g., polystyrene type, polyolefin type, polyvinyl chloride type, polyurethane type, polyamide type, polyurea, polyester type and fluorine resin type). The rubbers and the elastomers may be used alone or in combination.

A resistance adjusting conductive material, which may be added to the intermediate transfer member as necessary, is not specifically limited. Examples of the resistance adjusting conductive material include and are not limited to carbon black, graphite, a powder of metal such as aluminum and nickel, a conductive metal oxide such as tin oxide, titanium oxide, antimony oxide, indium oxide, potassium titanate, antimony-tin double oxide (ATO) and indium-tin double oxide (ITO). The conductive metal oxide may be coated with non-conductive fine particles such as barium sulfate fine particles, magnesium silicate fine particles and calcium carbonate fine particles.

The material for forming a surface layer of the intermediate transfer member is not specifically limited as long as it reduces adhesion of the toner to the surface of the intermediate transfer belt to enhance secondary transferability thereof. For example, the surface layer may be composed of a resin such as polyurethane resins, polyester resins and epoxy resins or a mixture thereof in which a powder or particles, or a mixture of powders or particles with different diameter, of a material which reduces surface energy and enhances lubricity such as fluoroplastics, fluorine compounds, carbon fluoride, titanium dioxide and silicon carbide or a mixture thereof are dispersed. A fluoro rubber on which a fluorine-rich layer is formed by heat treatment to reduce surface energy may be also used.

The method of producing the belt is not specifically limited. Examples of the belt producing method include and are not limited to a centrifugal molding method in which the material is poured into a rotating cylindrical mold, a spray coating method in which a thin film is formed on a surface of a mold, a dipping method in which a cylindrical mold is immersed in a material solution and drawn up, an injection molding method in which the material is pored between inner and outer molds, and a method in which a surface of a compound wound on a cylindrical mold is vulcanized and polished. The methods may be employed in combination.

Examples of methods of preventing elongation of the elastic belt include but are note limited to a method in which a rubber layer is formed on a core resin layer, a method in which a material which can prevent the elongation is added in a core layer.

Examples of materials for use in forming the core layer for preventing elongation of the elastic belt include and are not limited to natural fibers such as cotton, silk; synthetic fibers such as polyester fibers, nylon fibers, acrylic fibers, polyolefin fibers, polyvinyl alcohol fibers, polyvinyl chloride fibers, polyvinylidene chloride fibers, polyurethane fibers, polyacetal fibers, polyfluoroethylene fibers, phenol fibers; inorganic fibers such as carbon fibers, glass fibers, boron fibers; and metal fibers such as iron fibers and copper fibers. The materials may be used in the form of a woven fabric or threads and used in alone or in combination.

The thread may be of one filament or a strand of filaments, or may be a single twisted yarn, plied yarn or two-ply yarn. A plurality of types of fibers selected from the above group may be mixed. The strand threads may be subjected to suitable conductive treatment.

The woven fabric may be woven in any method, for example, by knitting, and a union fabric can be also used. The woven fabric may be subjected to conductive treatment.

The method for providing a core layer is not specifically limited. Examples of the core layer providing method include a method in which a cover layer is formed on a fabric woven into a cylindrical shape and laid on a mold or the like, a method in which a woven fabric woven into a cylindrical shape is immersed in a liquid rubber or the like to form a cover layer on one or both sides thereof, and a method in which a coating layer is formed on a thread helically wound on a mold or the like at a given pitch.

When the thickness of the elastic layer is excessively large (about 1 mm or larger), the surface thereof expands and contracts so largely as to generate cracks therein or deformation of a printed image, although it depends on the hardness thereof.

The elastic layer preferably has a hardness in a range of 10 to 65° (JIS-A), although the hardness must be adjusted according to the thickness of the belt. A belt having a hardness (JIS-A) of less than 10° is very difficult to form with dimensional accuracy. This is because the belt is likely to be subjected to contract or expansion. In order to soften a belt, an oil component is frequently added in the support. However, when the belt is continuously used under pressure, the oil component bleeds out and contaminates the photoconductor in contact with the surface of the intermediate transfer member, causing streaks in a lateral direction in a printed image.

In general, an intermediate transfer belt is provided with a surface layer to improve releasing property thereof. In order to prevent the oil component from bleeding out completely, the surface layer is required to be excellent in quality, in durability, for example, so that it is difficult to select the material therefor and to ensure properties required thereto. On the other hand, an elastic layer having a hardness (JIS-A) of at least 65° has sufficient hardness and thus can be formed with accuracy. Also, the elastic layer can be formed with a small amount of oil component or without oil component, so that the contamination of the photoconductor by the oil can be reduced. However, the elastic layer cannot provide an effect of improving toner transferability and makes it difficult to train the intermediate transfer belt over rollers.

Image forming method employable in the image forming apparatus of the present invention include a method in which toner images of different colors are formed on a single photoconductor and transferred on an output medium or an intermediate transfer member in succession and a tandem method in which toner images of different colors are formed on a plurality of photoconductors, respectively, and transferred onto an output medium or an intermediate transfer member. In order to respond to needs for high-speed image forming, it is preferable to use a plurality of photoconductors. Especially, in order to form a high-quality image, tandem type indirect transfer method is highly preferred in which toner images of different colors are formed on a plurality of photoconductors and transferred onto an elastic intermediate transfer belt, and then the laminated toner image is secondarily transferred onto an output medium.

In a tandem type image forming apparatus, toner images of are formed on a plurality of photoconductors, so that the I(S) of each of the photoconductors must be in the range herein shown. Otherwise, an unnatural printed image with interference fringes of a specific color is produced.

Figure 6:
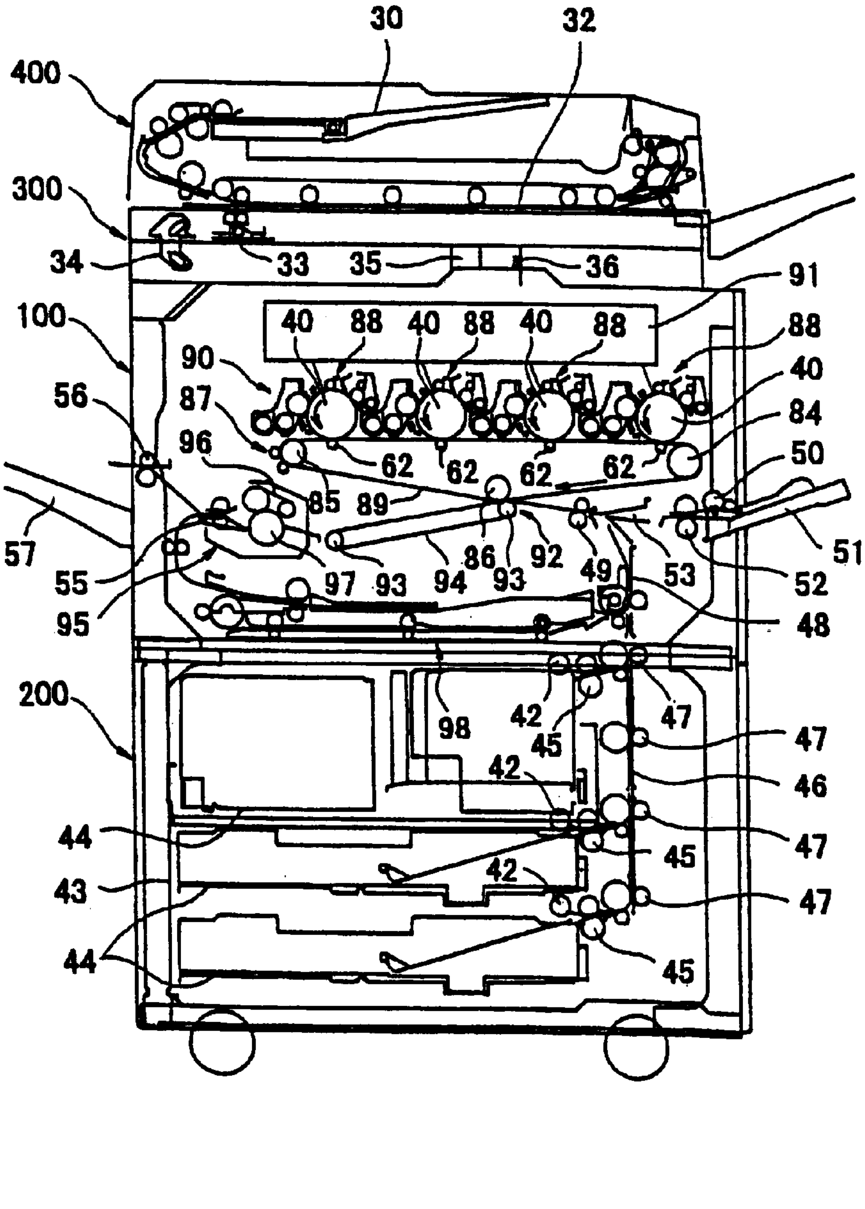
FIG. 6 is a schematic view showing a tandem-type color image forming apparatus according to the present invention.

FIG. 6 shows a tandem-type color image forming apparatus employing an indirect transfer system.

In FIG. 6, designated as 100 is a copying machine main body, as 200 is a sheet supply table on which the copying machine main body 100 is mounted, as 300 is a scanner mounted on the copying machine main body 100, as 400 is an automatic draft feeder (ADF) mounted on the scanner 300.

The copying machine main body 100 is equipped with an endless belt type intermediate transfer member 89 in a center part thereof.

As shown in FIG. 6, the intermediate transfer member 89 is trained over first, second and third support rollers 84, 85 and 86 so as to be able to rotationally transport a sheet in a clockwise direction as seen in FIG. 6.

In the illustrated example, an intermediate transfer member cleaning unit 87 is provided on the left side of the second support roller 85 for removing residual toner remaining on the intermediate transfer member 89 after transfer of an image.

Above a portion of the intermediate transfer member 89 extending between the support rollers 84 and 85, four image forming means 88 for forming black, yellow, magenta and cyan images, respectively, are disposed in a row along the transporting direction of the intermediate transfer member 89, thereby constituting a tandem image forming unit 90. Above the tandem image forming unit 90 is provided an exposure unit 91 as shown in FIG. 6.

On the other side of the tandem image forming unit 90 with respect to the intermediate transfer member 89 is disposed a secondary transfer unit 92 for transferring an image on the intermediate transfer member 89 to a sheet. The secondary transfer unit 92 comprises two rollers 93 and an endless secondary transfer belt 94 trained between the rollers 93 and disposed in pressure contact with the third support roller 86 with the intermediate transfer member 89 interposed therebetween.

A fixing unit 95 for fixing an image transferred onto a sheet is disposed on one side of the secondary transfer unit 92. The fixing unit 95 comprises an endless fixing belt 96 and a pressure roller 97 disposed in pressure contact with the fixing belt 96.

The secondary transfer unit 92 also has a function of transporting a sheet on which an image has been transferred to the fixing unit 95. As the secondary transfer unit 92, a transfer roller or non-contact charger may be provided. In such a case, it is difficult for the secondary transfer unit 92 to have the sheet transporting function.

In the illustrated example, a sheet reversing unit 98 for reversing a sheet to perform double-side printing is disposed below the secondary transfer unit 92 and the fixing unit 95 and in parallel to the tandem image forming unit 90.

When a copy is produced with the color electrophotographic apparatus, a draft is placed on a draft table 30 of the automatic draft feeder 400, or the automatic draft feeder 400 is opened and a draft is placed on a contact glass 32 of the scanner 300 and the automatic draft feeder 400 is closed to hold the draft therewith.

When a start switch (not shown) is pressed, the scanner 300 is actuated to drive a first running body 33 and a second running body 34 after the draft has been transferred onto the contact glass 32 in the case where the draft was placed on the automatic draft feeder 400, or immediately in the case where the draft is placed on a contact glass 32. The first running body 33 emits light from a light source thereof to the draft surface. Light reflected on the draft surface is reflected by the first running body 33 to the second running body 34, reflected on a mirror thereof and inputted into a read sensor 36 through an image forming lens 35, whereby the draft is read.

When the start switch (not shown) is pressed, one of the rollers 84, 85 and 86 is rotated by a driving motor (not shown). Thereby, the other two rollers are driven to rotate the intermediate transfer member 89. At the same time, photoconductors 40 of the image forming means 88 are rotated and single color images of black, yellow, magenta and cyan are formed on each of the photoconductors 40. Along with the rotation of the intermediate transfer member 89, the single color images are transferred thereonto in succession, thereby forming a superimposed color image on the intermediate transfer member 89.

At the same time, one of sheet supply rollers 42 in the sheet supply table 200 is selected and driven to feed out sheets from one of sheet supply cassettes arranged in a multistage form in a paper bank 43. The sheets are separated one by one by a separation roller 45. The separated sheet is fed into a sheet supply passage 46, transferred by a transport roller 47 through a sheet supply passage 48 until coming into contact with a resist roller 49. Or, a sheet supply roller 50 is rotated to feed sheets on a manual feeding tray 51 into the copying machine main body 100. The sheets are separated one by one by a separation roller 52. The separated sheet is fed through a manual feeding passage 53 until coming into contact with a resist roller 49.

Then, the resist roller 49 is rotated in a synchronized relationship with the superimposed color image on the intermediate transfer member 89 and the sheet is fed between the intermediate transfer member 89 and the secondary transfer unit 92, whereby the superimposed color image is transferred onto the sheet by the secondary transfer unit 92.

The sheet on which the image has been transferred is transported by the secondary transfer unit 92 to the fixing unit 95, where the transferred image is fixed by applying heat and pressure thereon. Then, the sheet discharged by a discharge roller 56 and stacked on a discharge tray 57 or fed into the sheet reversing unit 98. The transporting directions are switched by a switching claw 55. The sheet fed into the sheet reversing unit 98 is reversed therein, introduced to the transfer position again, where an image is also formed on the reverse side of the sheet. Then, the sheet is discharged onto the discharge tray 57 by the discharge roller 56

After transfer of the image, residual toner remaining on the intermediate transfer member 89 was removed by the intermediate transfer member cleaning unit 87 in preparation for the next image forming by the tandem image forming unit 90.

The resist roller 49 is usually earthed but may be applied with a bias to remove paper powder on sheets. In an intermediate transfer system, paper powder is not likely to be transported to photoconductors and thus does not have to be taken into consideration. Thus, the resist roller 49 may be earthed.

As the applied voltage, a DC bias is applied, but it may be an AC voltage having a DC offset component to electrify the sheet more uniformly.

The surfaces of the sheet passed through the resist roller 49 applied with bias is slightly negatively charged. Thus, the conditions in transferring of an image from the intermediate transfer member 89 to a sheet must be changed from those in the case where no voltage is applied to the resist roller 49.

Figure 7:
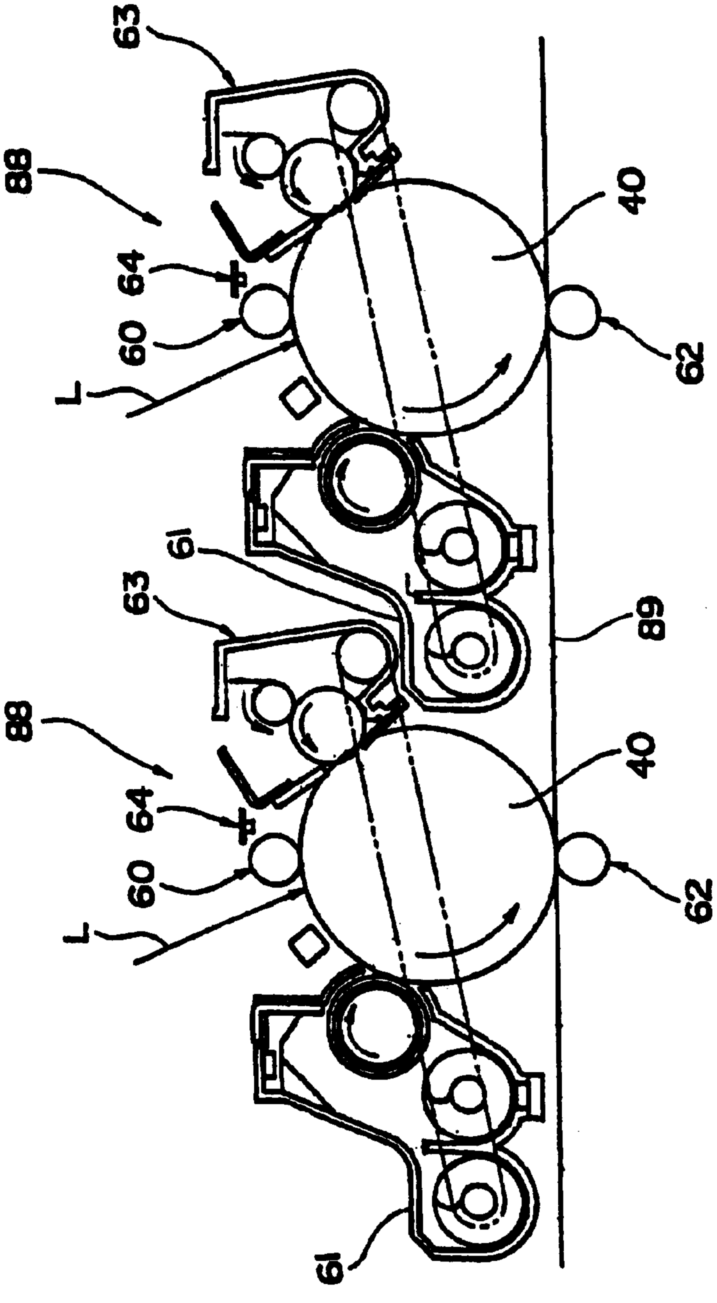
FIG. 7 is a fragmentary view showing an image forming section of FIG. 6.

In the above tandem image forming apparatus 90, each of the image forming means 88 comprises, as shown in FIG. 7, the drum shaped photoconductor 40, and a charging unit 60, a fixing unit 61, a first transfer unit 62, a photoconductor cleaning unit 63, a discharge unit 64 and so on, which are provided around the photoconductor 40.

The following examples will further illustrate the present invention. Parts are by weight.

EXAMPLES 1 TO 3, COMPARATIVE EXAMPLE 1

15 Parts of an acrylic resin (Acrydic A-460-60, made by Dainippon Ink & Chemicals, Inc.) and 10 parts of a melamine resin (Super Beckamine L-121-60, made by Dainippon Ink & Chemicals, Inc.) were dissolved in 80 parts of methyl ethyl ketone. To the solution was added 90 parts of a titanium oxide powder (TM-1, made by Fuji Titanium Industry Co., Ltd.). The mixture was dispersed in a ball mill for 12 hours to prepare a coating liquid for an undercoat layer. An aluminum drum having a diameter of 90 mm, a length of 352 mm and a thickness of 2 mm was immersed in the undercoat layer coating liquid and then vertically drawn up at a constant rate to coat the drum with the coating liquid. The aluminum drum was moved to a drying room with its attitude maintained and dried therein at 140° C. for 20 minutes to form an undercoat layer having a thickness of 2.5 μm thereon.

15 Parts of a butyral resin (S-LEC BLS, made by Sekisui Chemical Co., Ltd.) were dissolved in 150 parts of cyclohexanone. To the solution were added 10 parts of a tris-azo pigment having a structure represented by the following structural formula (1). This was then dispersed in a ball mill for 48 hours.

(1)

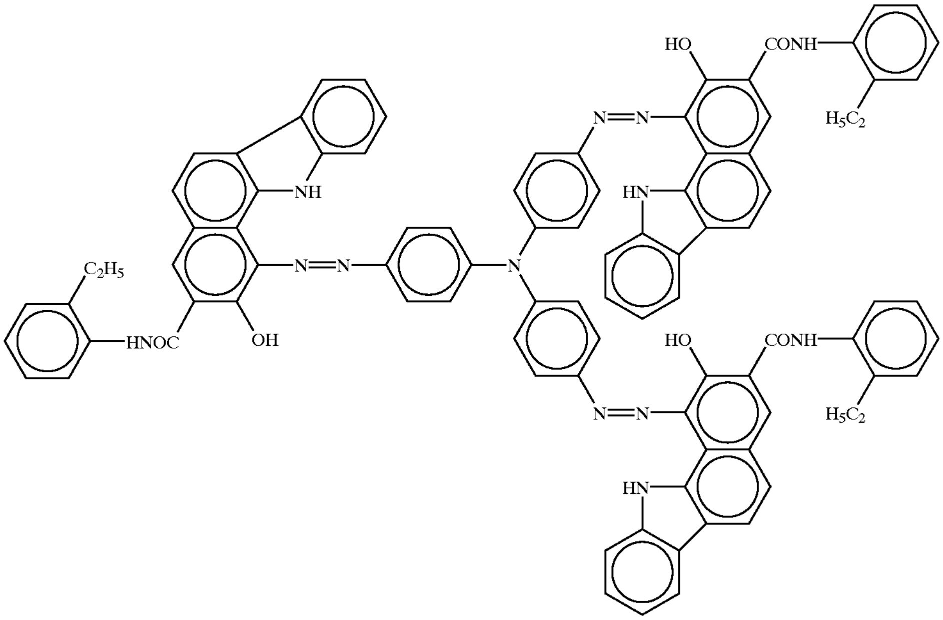

To the dispersion were added 210 parts of cyclohexanone. This was dispersed for 3 hours and then diluted with cyclohexanone with stirring such that the solid content was 1.5% by weight, thereby obtaining a coating liquid for a charge generating layer. The aluminum drum on which the undercoat layer had been formed was immersed in the charge generating layer coating liquid to coat the drum with the coating liquid and then dried as in the case of the undercoat layer at 120° C. for 20 minutes to form a charge generating layer having a thickness of about 0.2 μm.

The aluminum drum on which the undercoat layer and the charge generating layer had been formed was then immersed in a coating liquid for a charge transporting layer obtained by dissolving 6 parts of a charge transporting material having a structure represented by the following structural formula (2), 10 parts of a polycarbonate resin (Panlite K-1300, made by Teijin Chemicals, Ltd.), 0.002 parts of a silicone oil (KF-50, made by Shin-Etsu Chemical Co., Ltd.) in 90 parts of methylene chloride.

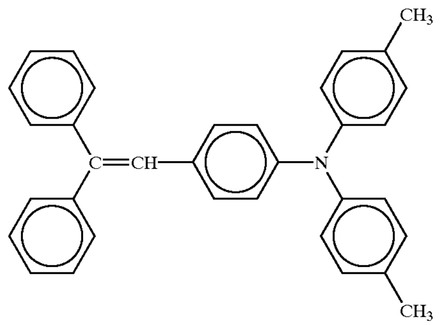

(2)

The aluminum drum was drawn up halfway at a constant rate and then stopped. Two seconds later, the aluminum drum was drawn up again at the same rate and then dried as in the case of the undercoat layer at 120° C. for 20 minutes, whereby a charge transporting layer having an average thickness of about 23 μm was formed on the charge generating layer. The charge transporting layer had a center part which had a longitudinal length of about 40 mm and which was sloped in the longitudinal direction so that the thickness variation in this area was about 1 μm.

The surfaces of three of the four photoconductors thus obtained were wrapped with a wrapping tape (C-2000, made by Fuji Photo Film Co., Ltd.) for 60 seconds, 90 seconds and 120 seconds, respectively, thereby obtaining photoconductors of Examples 1 to 3. The one whose surface was not wrapped was designated as Comparative Example 1.

The surface of each of the thus obtained photoconductors was measured for a sectional curve using a surface roughness meter (Surfcom 1400A, made by Tokyo Seimitsu K.K.). From the sectional curve, N=4096 points were sampled at an interval of Δt=1250/4096 μm in a main scanning direction and subjected to the discrete Fourier transform. Then, the power spectrum was calculated and the I(S) was obtained therefrom.

Each of the photoconductors was incorporated in a copying machine (Imagio Color 2800 made by Ricoh Company, Ltd.; wavelength of writing light: 780 nm, resolution of output image: 400 dpi) employing a 12-level halftone reproduction system by combination of pulse width modulation and power modulation, and a uniform black-and-white halftone image was printed out. The results are summarized in Table 1.

TABLE 1

| | I(S) | Black-and-white halftone image |
|---|---|---|
| Ex. 1 | $3.4 \times 10^{-3}$ | Uniform. No image defects. |
| Ex. 2 | $5.6 \times 10^{-3}$ | Uniform. No image defects. |
| Ex. 3 | $7.0 \times 10^{-3}$ | Uniform. No image defects. |
| Comp. Ex. 1 | $1.8 \times 10^{-3}$ | Several sets of interference fringes observed at a center part of the image. |

EXAMPLES 4 TO 6 AND COMPARATIVE EXAMPLE 2

A halftone image was printed out in the same manner as in Examples 1 to 3 and Comparative Example 1 except that the copying machine (Imagio Color 2800) was modified such that the resolution of an output image was 600 dpi. The results are summarized in Table 2.

TABLE 2

| | Black-and-white halftone image |
|---|---|
| Ex. 4 | Uniform. No image defects. |
| Ex. 5 | Uniform. No image defects. |
| Ex. 6 | Uniform. No image defects. |
| Comp. Ex. 2 | 3 Sets of interference fringes observed at a center part of the image. |

EXAMPLES 7 TO 9 AND COMPARATIVE EXAMPLE 3

A halftone image was printed out in the same manner as in Examples 1 to 3 and Comparative Example 1 except that the copying machine (Imagio Color 2800) was modified such that the resolution of an output image was 1200 dpi. The results are summarized in Table 3.

TABLE 3

| | Black and white halftone image |
|---|---|
| Ex. 7 | No clear interference fringes observed but an unnatural part was at a center of the image. |
| Ex. 8 | Uniform. No image defects. |
| Ex. 9 | Uniform. No image defects. |
| Comp. Ex. 3 | 5 Sets of interference fringes observed at a center part of the image. |

EXAMPLE 10

3 Parts of an alkyd resin (Bekkozol 1307-60-EL, made by Dainippon Ink & Chemicals, Inc.), 2 parts of a melamine resin (Super Bekkamin G-821-60, made by Dainippon Ink & Chemicals, Inc.) were dissolved in 100 parts of methyl ethyl ketone. To the solution were added 20 parts of a titanium oxide powder (CR-EL made by Ishihara Sangyo Kaisha, Ltd.). The mixture was dispersed in a ball mill for 200 hours to prepare a coating liquid for an undercoat layer.

An aluminum drum having a diameter of 30 mm, a length of 340 mm and a thickness of about 0.75 mm was immersed in the undercoat layer coating liquid and then vertically drawn up at a constant rate to coat the drum with the coating liquid. The aluminum drum was moved to a drying room with its attitude maintained and dried therein at 140° C. for 20 minutes to form an undercoat layer having a thickness of 3.5 μm thereon.

2 Parts of a polyvinyl butyral resin (XYHL, made by Union Carbide Corp.) were dissolved in 200 parts of methyl ethyl ketone. To the solution were added 10 parts of a bis azo pigment having a structure represented by the following structural formula (3). This was then dispersed in a ball mill for 340 hours.

(3)

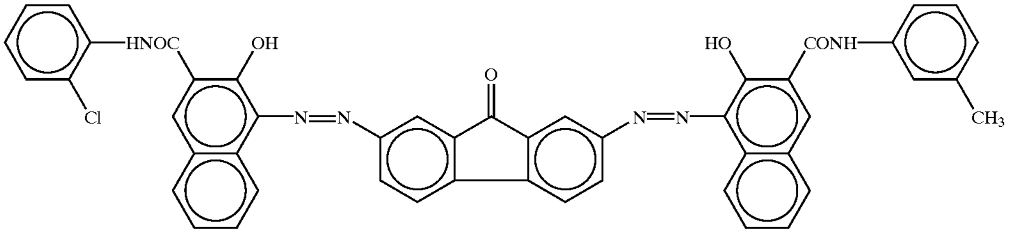

To the dispersion were added 200 parts of cyclohexanone. This was dispersed for 1 hour and then diluted with cyclohexanone with stirring such that the solid content was 1.5% by weight, thereby obtaining a coating liquid for a charge generating layer. The aluminum drum on which the undercoat layer had been formed was immersed in the charge generating layer coating liquid to coat the drum with the coating liquid and then dried as in the case of the undercoat layer at 120° C. for 20 minutes to form a charge generating layer having a thickness of about 0.2 μm.

1 Part of a charge transporting material having a structure represented by the following structural formula (4), 1 part of a bisphenol Z type polycarbonate and 0.02 parts of a silicone oil (KF-50 made by Shin-Etsu Chemical Co., Ltd.) were dissolved in 10 parts of tetrahydrofuran, thereby obtaining a coating liquid for a charge transporting layer. The aluminum drum on which the undercoat layer and the charge generating layer had been formed was immersed in the charge transporting layer coating liquid to coat the drum with the coating liquid and dried as in the case of the undercoat layer at 120° C. for 20 minutes to form a charge transporting layer having a thickness of about 23 μm on the charge generating layer.

(4)

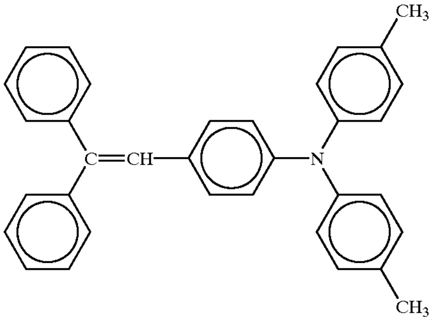

3 Parts of the above charge transporting material, 3 parts of an aluminum oxide powder having a purity of 4N and an average particle size of 0.3 μm and 4 parts of a bisphenol Z type polycarbonate were dissolved in 50 parts of cyclohexanone. The solution was dispersed for 24 hours, then diluted with tetrahydrofuran such that the solid content was 5% by weight and further dispersed. The dispersion was coated over the charge transporting layer by a ring coating method to form an uppermost layer having a thickness of about 3 μm.

The surface of the thus obtained photoconductor was measured for a sectional curve using a surface roughness meter (Surfcom 1400A, made by Tokyo Seimitsu K.K.). From the sectional curve, N=4096 points were sampled at an interval of Δt=1250/4096 μm in the main scanning direction and subjected to the discrete Fourier transform. Then, the power spectrum was calculated. The I(S), as obtained from the power spectrum, was $7.0\times10^{-3}$.

The photoconductor was incorporated in a copying machine (Imagio MF2200 made by Ricoh Company, Ltd.) modified such that the wavelength of the writing light was 655 nm and the resolution of an output image was 600 dpi to fabricate an image forming apparatus. When a uniform black-and-white halftone image was printed out using the image forming apparatus, a uniform black-and-white halftone image free from image defects such as interference fringes was able to be obtained.

EXAMPLES 11 TO 14, COMPARATIVE EXAMPLE 4

Four photoconductors were prepared in the same manner as in example 10 except that the average particle size of the aluminum oxide powder for use in forming the outermost layer was changed to 0.2 μm, 0.4 μm, 0.7 μm and 1.2 μm, respectively. A photoconductor was prepared in the same manner as in example 10 except that no aluminum oxide powder was used, and designated as Comparative Example 4. The surface of each of the thus obtained photoconductors was measured for a sectional curve using a surface roughness meter (Surfcom 1400A, made by Tokyo Seimitsu K.K.). From the sectional curve, N=4096 points were sampled at an interval of Δt=1250/4096 μm in the main scanning direction and subjected to discrete Fourier transform. Then, the power spectrum was calculated and the I(S) was obtained therefrom.

Using each of the photoconductors, an image forming apparatus was fabricated in the same manner as in Example 10. Using the image forming apparatus, a black-and-white halftone image was printed out. The results are summarized in Table 4.

TABLE 4

| | Average particle size (μm) | I(S) | Black-and-white halftone image |
|---|---|---|---|
| Ex. 11 | 0.2 | $7.0\times10^{-3}$ | Uniform. No image defects. |
| Ex. 12 | 0.4 | $9.1\times10^{-3}$ | Uniform. No image defects. |
| Ex. 13 | 0.7 | $54.5\times10^{-3}$ | Uniform. No image defects. |
| Ex. 14 | 1.2 | $156.4\times10^{-3}$ | No interference fringe but there were some black spots. |
| Comp. Ex. 4 | — | $1.2\times10^{-3}$ | 3 Sets of interference fringes at an edge part of the image. |

EXAMPLE 15

A photoconductor was prepared in the same manner as in Example 10 except that a titanium oxide powder having an average particle size of 0.3 μm was used in place of the aluminum oxide powder having a purity of 4N and an average particle size of 0.3 μm.

The I(S) of the surface of the photoconductor, as obtained in the same manner as in Example 10, was $6.7\times10^{-3}$.

The photoconductor was incorporated in a copying machine (Imagio MF2200) modified in the same manner as in Example 10 to fabricate an image forming apparatus. When a black-and-white halftone image was outputted using the image forming apparatus, a uniform halftone image free from image defects such as interference fringes was able to be obtained.

Using the fabricated image forming apparatus and the image forming apparatus fabricated in Example 10, a black-and-white halftone image was printed out after printing had been conducted on 5000 sheets under conditions of 30° C. and 85% (relative humidity). A uniform image was obtained with the image forming apparatus fabricated in Example 10. The image printed out with the apparatus fabricated in Example 15 was free from interference fringes but had a slight blur in a part thereof.

EXAMPLE 16

A photoconductor was prepared in the same manner as in Example 10 except that a charge transporting material having a structure represented by the following structural formula (5) was used in place of the charge transporting material used in Example 10.

(5)

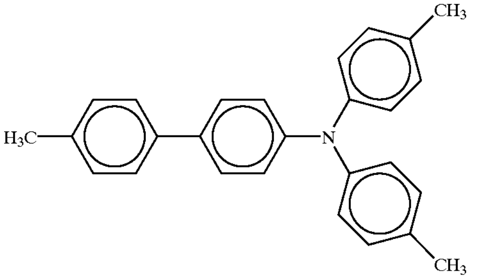

The I(S) of the surface of the photoconductor, as obtained in the same manner as in Example 10, was $12.2\times10^{-3}$.

The I(S) obtained by sampling N=8192 points at an interval of Δt=1250/8192 μm in a horizontal direction and the I(S) obtained by sampling N=8192 points at an interval of Δt=5000/8192 μm in the main scanning direction were $12.0\times10^{-3}$ and $12.4\times10^{-3}$, respectively, which were almost the same as the I(S) obtained in the same manner as in Example 10.

The photoconductor was incorporated in a copying machine (Imagio MF2200 made by Ricoh Company, Ltd.) modified such that the wavelength of the writing light was 504 nm and the resolution of an output image was 600 dpi to fabricate an image forming apparatus. When a uniform black-and-white halftone image was printed out using the image forming apparatus, a uniform black-and-white halftone image free from image defects such as interference fringes was able to be obtained.

EXAMPLE 17

3 Parts of an alkyd resin (Bekkozol 1307-60-EL, made by Dainippon Ink & Chemicals, Inc.), 2 parts of a melamine resin (Super Bekkamin G-821-60, made by Dainippon Ink & Chemicals, Inc.) were dissolved in 100 parts of methyl ethyl ketone. To the solution were added 20 parts of a titanium oxide powder (CR-EL, made by Ishihara Sangyo Kaisha, Ltd.). The mixture was dispersed in a ball mill for 200 hours to prepare a coating liquid for an undercoat layer.

An aluminum drum having a diameter of 90 mm, a length of 352 mm and a thickness of 2 mm was immersed in the undercoat layer coating liquid and then vertically drawn up at a constant rate to coat the drum with the coating liquid. The aluminum drum was moved to a drying room with its attitude maintained and dried therein at 140° C. for 20 minutes to form an undercoat layer having a thickness of 3.5 μm thereon.

2 Parts of a polyvinyl butyral resin (XYHL, made by Union Carbide Corp.) were dissolved in 200 parts of methyl ethyl ketone. To the solution were added 10 parts of a bis azo pigment having a structure represented by the following structural formula (6). This was then dispersed in a ball mill for 340 hours.

(6)

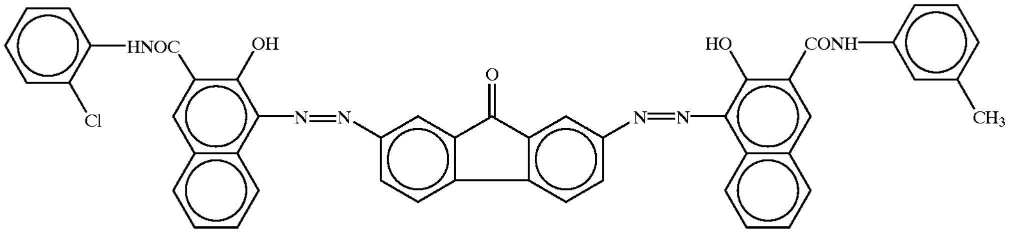

To the dispersion were added 200 parts of cyclohexanone. This was dispersed for 1 hour and then diluted with cyclohexanone with stirring such that the solid content was 1.5% by weight, thereby obtaining a coating liquid for a charge generating layer. The aluminum drum on which the undercoat layer had been formed was immersed in the charge generating layer coating liquid to coat the drum with the coating liquid and then dried as in the case of the undercoat layer at 120° C. for 20 minutes to form a charge generating layer having a thickness of about 0.2 μm.

1 Part of a charge transporting material having a structure represented by the following structural formula (7), 1 part of a bisphenol Z type polycarbonate and 0.02 parts of a silicone oil (KF-50, made by Shin-Etsu Chemical Co., Ltd.) were dissolved in 10 parts of tetrahydrofuran, thereby obtaining a coating liquid for a charge transporting layer. The aluminum drum on which the undercoat layer and the charge generating layer had been formed was then immersed in the charge transporting layer coating liquid to coat the drum with the coating liquid and dried as in the case of the undercoat layer at 120° C. for 20 minutes to form a charge transporting layer having a thickness of about 14 μm on the charge generating layer.

(7)

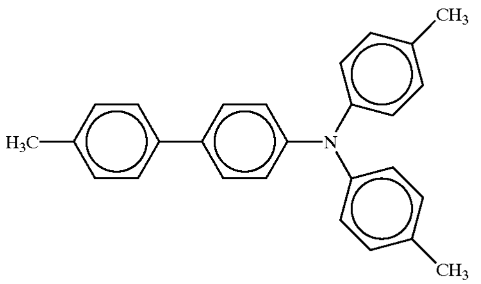

3 Parts of the above charge transporting material, 3 parts of an aluminum oxide particle having a purity of 4N and an average particle size of 0.3 μm and 4 parts of a bisphenol Z type polycarbonate were dissolved in 50 parts of cyclohexanone. The solution was dispersed for 36 hours, then diluted with tetrahydrofuran such that the solid content was 5% by weight and further dispersed. The dispersion was coated over the charge transporting layer by a spray coating method to form an uppermost layer having a thickness of about 4 μm.

The surface of the thus obtained photoconductor was measured for a sectional curve using a surface roughness meter (Surfcom 1400A, made by Tokyo Seimitsu K.K.). From the sectional curve, N=4096 points were sampled at an interval of Δt=2500/4096 μm in the main scanning direction and subjected to discrete Fourier transform. Then, the power spectrum was calculated. The I(S), as obtained from the power spectrum, was $14.8\times10^{-3}$.

The photoconductor was incorporated in a copying machine (Imagio Color 2800 made by Ricoh Company, Ltd.) modified such that the wavelength of the writing light was 504 nm and the resolution of an output image was 1200 dpi to fabricate an image forming apparatus. When a uniform black-and-white halftone image was printed out using the image forming apparatus, a uniform black-and-white halftone image free from image defects such as interference fringes was able to be obtained.

EXAMPLE 18

A photoconductor was prepared in the same manner as in Example 17 except that an aluminum drum having a surface cut with a cutting machine employing a diamond bit.

The surface of the aluminum drum was measured for a sectional curve using a surface roughness meter (Surfcom 1400A). From the sectional curve, N=4096 points were sampled at an interval of Δt=2500/4096 μm in the main scanning direction and subjected to discrete Fourier transform. Then, the power spectrum was calculated. The I(S), as obtained from the power spectrum, was $14.0\times10^{31\ 3}$.

The power spectrum of the surface of the undercoat layer was calculated as in the case of that of the aluminum drum surface. The I(S), as obtained from the power spectrum, was $16.2\times10^{-3}$.

The power spectrum of the surface of the thus prepared photoconductor was calculated in the same manner as in Example 17. The I(S) obtained from the power spectrum was $16.8\times10^{-3}$. The power spectrum obtained from the sectional curve of the surface of the photoconductor is shown in FIG. 8.

The photoconductor was incorporated in Imagio MF 2200 modified such that the wavelength of writing light was 504 nm and the resolution of an output image was 1200 dpi to fabricate an image forming apparatus. When a uniform black-and-white halftone image was printed out using the image forming apparatus, a uniform halftone image free from interference fringes was able to be obtained.

The I'(S), as obtained using a maximum integer n' satisfying the equation: $n'/(N\cdot\Delta t)\leqq 250(n'/(4096\times2500/4096)\leqq 1/250$, thus n'=10 at maximum), was $2.2\times10^{-3}$. Thus, I'(S)/I(S)=0.132.

COMPARATIVE EXAMPLE 5

A photoconductor was prepared in the same manner as in Example 17 except that no uppermost layer was formed. The I(S), as obtained using the power spectrum obtained in the same manner as in Example 17, was $1.9\times10^{-3}$.

The photoconductor was incorporated in a copying machine (Iamgio MF 2200) modified such that the wavelength of the writing light was 504 nm and the resolution of an output image was 1200 dpi to fabricate an image forming apparatus. When a uniform black-and-white halftone image was printed out using the image forming apparatus, interference fringes were occurred.

EXAMPLE 19

3 Parts of an alkyd resin (Bekkozol 1307-60-EL, made by Dainippon Ink & Chemicals, Inc.), 2 parts of a melamine resin (Super Bekkamin G-821-60, made by Dainippon Ink & Chemicals, Inc.) were dissolved in 100 parts of methyl ethyl ketone. To the solution was added 20 parts of a titanium oxide powder (CR-EL, made by Ishihara Sangyo Kaisha, Ltd.). The mixture was dispersed in a ball mill for 200 hours to prepare a coating liquid for an undercoat layer.

An aluminum drum having a diameter of 90 mm, a length of 352 mm and a thickness of 2 mm and having a surface cut with a cutting machine employing a diamond bit was immersed in the undercoat layer coating liquid and then vertically drawn up at a constant rate to coat the drum with the coating liquid. The aluminum drum was moved to a drying room with its attitude maintained and dried therein at 140° C. for 20 minutes to form an undercoat layer having a thickness of 3.5 μm thereon.

2 Parts of a polyvinyl butyral resin (XYHL, made by Union Carbide Corp.) were dissolved in 200 parts of methyl ethyl ketone. To the solution were added 10 parts of a bis azo pigment having a structure represented by the following structural formula (8). This was then dispersed in a ball mill for 340 hours.

(8)

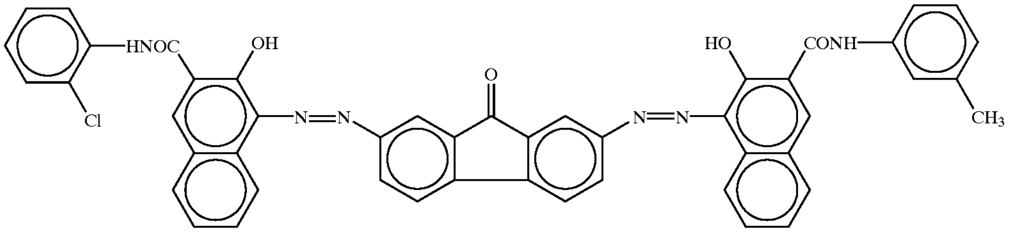

To the dispersion were added 200 parts of cyclohexanone. This was dispersed for 1 hour and then diluted with cyclohexanone with stirring such that the solid content was 1.5% by weight, thereby obtaining a coating liquid for a charge generating layer. The aluminum drum on which the undercoat layer had been formed was immersed in the charge generating layer coating liquid to coat the drum with the coating liquid and then dried as in the case of the undercoat layer at 120° C. for 20 minutes to form a charge generating layer having a thickness of about 0.2 μm.

1 Part of a charge transporting material having a structure represented by the following structural formula (9), 1 part of a bisphenol Z type polycarbonate and 0.02 parts of a silicone oil (KF-50, made by Shin-Etsu Chemical Co., Ltd.) were dissolved in 10 parts of tetrahydrofuran, thereby obtaining a coating liquid for a charge transporting layer. The aluminum drum on which the undercoat layer and the charge generating layer had been formed was then immersed in the charge transporting layer coating liquid to coat the drum with the coating liquid and then dried as in the case of the undercoat layer at 120° C. for 20 minutes to form a charge transporting layer having a thickness of 12.7 μm on the charge generating layer.

(9)

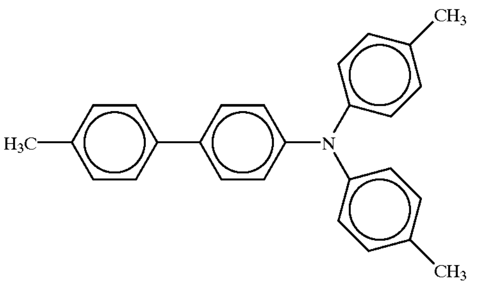

3 Parts of the above charge transporting material, 3 parts of an aluminum oxide powder having a purity of 4N and an average particle size of 0.3 μm and 4 parts of a bisphenol Z type polycarbonate and were dissolved in 50 parts of cyclohexanone. The solution was dispersed for 36 hours, then diluted with tetrahydrofuran such that the solid content was 5% by weight and further dispersed. The dispersion was coated over the charge transporting layer by a spray coating method to form an uppermost layer having a thickness of about 2 μm.

The surface of the thus obtained photoconductor was measured for a sectional curve using a surface roughness meter (Surfcom 1400A). From the sectional curve, N=4096 points were sampled at an interval of $\Delta t$=2500/4096 μm in the main scanning direction and subjected to discrete Fourier transform. Then, the power spectrum was calculated. The I(S), as obtained from the power spectrum, was $30.7\times10^{-3}$.

The I'(S), as obtained using a maximum integer n' satisfying the equation: $n'/(N\cdot\Delta t)\leqq 250$, namely n'=10 ($n'/(4096\times2500/4096)\leqq 1-250$, thus n'=10), was $12.0\times10^{-3}$. Thus, I'(S)/I(S)=0.390.

The photoconductor was incorporated in a copying machine (Iamgio MF 2200) modified such that the wavelength of the writing light was 504 nm and the resolution of an output image was 1200 dpi as in the case of Example 17 to fabricate an image forming apparatus. When a uniform black-and-white halftone image was printed out using the image forming apparatus, no interference fringes were occurred but an edge part of the image was seen as unnatural when stared.

EXAMPLE 20

Using the image forming apparatus fabricated in Example 17, a black-and-white halftone image was printed out after printing had been conducted on 50000 sheets. A uniform image free from interference fringes was able to be obtained.

At this time, the thickness of the photoconductive layer was decreased by 2.2% with respect to the initial thickness.

The surface of the photoconductor after the printing on 50000 sheets was measured for a sectional curve using a surface roughness meter (Surfcom 1400A). From the sectional curve, N=4096 points were sampled at an interval of $\Delta t$=2500/4096 μm in the main scanning direction and subjected to discrete Fourier transform. Then, the power spectrum was calculated. The I(S), as obtained from the power spectrum, was $18.5\times10^{-3}$.

EXAMPLE 21

Four photoconductors were prepared in the same manner as in Example 17 except that aluminum drums having a diameter of 60 mm were used and that 2.8 parts of an aluminum oxide powder having a purity of 4N and an average particle size of 0.3 μm were used in the outermost layer coating liquid. The I(S) of the surfaces of the photoconductors, as obtained in the same manner as in Example 17, were $7.6\times10^{-3}$, $8.9\times10^{-3}$, $8.2\times10^{-3}$ and $7.7\times10^{-3}$, respectively.

Using the four photoconductors, a tandem indirect transfer image forming apparatus as shown in FIG. 6 was fabricated. The wavelength of the writing light and the resolution of an output image were set at 655 nm and 600 dpi, respectively. The intermediate transfer was by an inelastic transfer belt mainly composed of polyvinylidene fluoride.

When a copy of a color Tokyo metropolitan area map (published by Obunsha) was produced, a high-quality image was able to be obtained. When a copy of a cell image for animation was produced, a void was found in an area adjacent to a high-density area as observed under magnification with a loupe, although it was not observable unless stared and thus in permissible level for practical use.

EXAMPLE 22

A cylindrical mold was immersed in a dispersant obtained by dispersing 18 parts of carbon black, 3 parts of a dispersant and 400 parts of toluene in 100 parts of polyvinylidene fluoride (PVDF) and gently drawn up at a rate of 10 mm/sec. This was dried at room temperature to obtain a uniform PVDF film having a thickness of 75 $\mu$m. The cylindrical mold on which the PVDF film having a thickness of 75 $\mu$m had been formed was again immersed in the same dispersant and gently drawn up at a rate of 10 mm/sec. This was dried at room temperature to obtain a PVDF film having a thickness of 150 $\mu$m. The cylindrical mold on which the PVDF film having a thickness of 150 $\mu$m had been formed was immersed in a dispersant obtained uniformly dispersing 100 parts of polyurethane prepolymer, 3 parts of a curing agent (isocyanate), 20 parts of carbon black, 3 parts of a dispersant and 500 parts of MEK and drawn up at 30 mm/sec. After air-drying, the process was repeated to form an urethane polymer layer having a thickness of 150 $\mu$m.

100 Parts of polyurethane prepolymer, 3 parts of a curing agent (isocyanate), 50 parts of PTFE fine particles, 4 parts of a dispersant and 500 parts of MEK were uniformly dispersed to prepare a coating liquid for a surface layer.

The cylindrical mold on which the urethane prepoymer film having a thickness of 150 $\mu$m had been formed was immersed in the surface layer coating liquid and drawn up at 30 mm/sec. After air-drying, the above process was repeated to form a urethane surface layer with a thickness of 5 $\mu$m in which the PTFE fine particles were uniformly dispersed. After drying at room temperature, this was subjected to crosslinking for 2 hours at 130° C., whereby an elastic intermediate transfer belt having a three-layer structure consisting of a resin layer; 150 $\mu$m, an elastic layer; 150 $\mu$m and a surface layer; 5 $\mu$m.

When a copy of a color Tokyo metropolitan area map (published by Shobunsha Publications, Inc.) was produced in the same manner as in Example 21 except that this intermediate transfer belt was used, a high-quality image was able to be obtained. When a copy of color cell image for animation was produced, a high-quality image having few image defects, as observed under magnification with a loupe, was able to be obtained.

COMPARATIVE EXAMPLE 6

A photoconductor was prepared in the same manner as in Example 21 except that no surface layer was formed. The I(S) of the surface of the photoconductor was $1.3\times10^{-3}$. The photoconductor was incorporated in the image forming apparatus of Example 21 in place of the photoconductor for forming a magenta toner image and a copy of the same color Tokyo metropolitan area map (published by Shobunsha Publications, Inc.) as in Example 21 was produced. There were very unnatural parts in same places in the image.

EXAMPLE 23

Using the image forming apparatus of Example 22, printing was conducted on 30000 sheets while zinc stearate was applied on the photoconductors. Thereafter, a copy of a color Tokyo metropolitan area map (published by Shobunsha Publications, Inc.) was produced. A high-quality image was able to be obtained. When a copy of a color cell image for animation was produced, there was able to be obtained a high-quality image having few image defects, as observed under magnification with a loupe. The I(S) of the surfaces of the photoconductors after the printing on 30000 sheets, as obtained in the same manner as in Example 22, were $9.3\times10^{-3}$, $9.5\times10^{-3}$, $8.9\times10^{-3}$, and 8.8x10–3, respectively.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

The teachings of Japanese Patent Application No. 2001-043955, filed Feb. 20, 2001, inclusive of the specification, claims and drawings, are hereby incorporated by reference herein.

What is claimed is:

1. An image forming apparatus comprising a photoconductor having a photoconductive layer provided on a support, and an exposing device for irradiating a surface of said photoconductor imagewise with a coherent light to form an electrostatic latent image thereon, the surface of said photoconductor having such characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of the photoconductor and is $2^p$ where p is an integer, Δt is a sampling interval, in $\mu$m, at which the N-number of the samples are sampled, said sectional curve being obtained by measuring a profile of the surface through a preset length N·Δt, x(t) is a height of the sectional curve, in $\mu$m, of a sample at a position t in said preset length, and n and m are integers.

2. An image forming apparatus as claimed in claim 1, wherein I(S) ranges from $5.0\times10^{-3}$ to $150.0\times10^{-3}$.

3. An image forming apparatus as claimed in claim 1, wherein Δt ranges from 0.01 to 50.00 $\mu$m and N is at least 2048.

4. An image forming apparatus as claimed in claim 1, wherein a ratio of I'(S) to I(S) satisfies with the following condition:

$$I'(S)/I(S)\leqq 0.35$$

where $$I'(S)=\left(\frac{1}{N}\right)\sum_{n=0}^{n'}\left\{S\left(\frac{n}{N\cdot\Delta t}\right)\right\}$$

wherein n' is the maximum integer satisfying n'/(N·Δt)≦1/250.

5. An image forming apparatus as claimed in claim 1, wherein particles are exposed from the surface of the photoconductor.

6. An image forming apparatus as claimed in claim 5, wherein said photoconductive layer comprises a charge transporting layer and wherein the particles have a refractive index which is 0.8 to 1.2 times that of the charge transporting layer.

7. An image forming apparatus as claimed in claim 6, wherein the particles exposed from the surface of the photoconductor has a particle diameter in the range of 0.01–1.00 $\mu$m.

8. An image forming apparatus as claimed in claim 1, wherein said photoconductive layer having a thickness of 15 $\mu$m or less.

9. An image forming apparatus as claimed in claim 1, wherein said photoconductive layer has an interface on the side of said support, said interface having such characteristics as to provide I(S) of at least $1.5\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the interface and is $2^p$ where p is an integer, Δt is a sampling interval, in $\mu$m, at which the N-number of the samples are sampled, said sectional curve being obtained by measuring a profile of the interface through a preset length N·Δt, x(t) is a height of the sectional curve, in $\mu$m, of a sample at a position t in said preset length, and n and m are integers.

10. An image forming apparatus as claimed in claim 9, wherein Δt ranges from 0.01 to 50.00 $\mu$m and N is at least 2048.

11. An image forming apparatus as claimed in claim 1, wherein said support has a surface on which said photoconductive layer is provided, said surface of said support having such characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of said support and is $2^p$ where p is an integer, Δt is a sampling interval, in $\mu$m, at which the N-number of the samples are sampled, said sectional curve being obtained by measuring a profile of the surface of said support through a preset length N·Δt, x(t) is a height of the sectional curve, in $\mu$m, of a sample at a position t in said preset length, and n and m are integers.

12. An image forming apparatus as claimed in claim 11, wherein Δt ranges from 0.01 to 50.00 $\mu$m and N is at least 2048.

13. An image forming apparatus as claimed in claim 1, wherein said coherent light has a wavelength of 700 nm or less.

14. An image forming apparatus as claimed in claim 1, wherein said exposing device is of a type which outputs an image by a multi-level gradation reproducing system.

15. An image forming apparatus as claimed in claim 1, and configured to produce an image with a resolution of 1000 dpi or higher.

16. An image forming apparatus as claimed in claim 1, further comprising means for applying a lubricant to the surface of the photoconductor.

17. An image forming apparatus as claimed in claim 16, wherein said lubricant is metal soap.

18. An image forming apparatus as claimed in claim 17, wherein said metal soap is zinc stearate.

19. An image forming apparatus as claimed in claim 1, and constructed into a full color image forming machine.

20. An image forming apparatus as claimed in claim 19, comprising a developing unit for developing the latent image with a developer to form a toner image on the photoconductor, an intermediate transfer member to receive the toner image from the photoconductor, and an image receiving medium to receive the toner image from the intermediate transfer member.

21. An image forming apparatus as claimed in claim 20, wherein said intermediate transfer member is an elastic belt.

22. An image forming apparatus as claimed in claim 19, comprising a plurality of photoconductors for forming a plurality of color toner images, respectively, an intermediate transfer member to receive the color toner images from respective photoconductors to form stacked color toner images, and an image receiving medium to receive the stacked color toner images from the intermediate transfer member.

23. An image forming apparatus as claimed in claim 22, wherein said intermediate transfer member is an elastic belt.

24. An image forming method wherein a coherent light is irradiated on a photoconductor having a photoconductive layer provided on a support to form an electrostatic latent image thereon, the surface of said photoconductor having such characteristics as to provide I(S) of at least $3.0\times10^{-3}$, wherein I(S) is given by the following equations:

$$I(S)=\left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right)=\frac{1}{N}\cdot\left|X\left(\frac{n}{N\cdot\Delta t}\right)\right|^2$$

$$X\left(\frac{n}{N\cdot\Delta t}\right)=\sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of the photoconductor and is $2^p$ where p is an integer, Δt is a sampling interval, in $\mu$m, at which the N-number of the samples are sampled, said sectional curve being obtained by measuring a profile of the surface through a preset length N·Δt, x(t) is a height of the sectional curve, in $\mu$m, of a sample at a position t in said preset length, and n and m are integers.

25. An image forming method as claimed in claim 24, wherein I(S) ranges from $5.0\times10^{-3}$ to $150.0\times10^{-3}$.

26. An image forming method as claimed in claim 24, wherein Δt ranges from 0.01 to 50.00 $\mu$m and N is at least 2048.

27. An image forming method as claimed in claim 24, wherein a ratio of I'(S) to I(S) satisfies with the following condition:

$$I'(S)/I(S) \leqq 0.35$$

where $$I'(S) = \left(\frac{1}{N}\right)\sum_{n=0}^{n'}\left\{S\left(\frac{n}{N\cdot\Delta t}\right)\right\}$$

wherein n' is the maximum integer satisfying $n'/(N\cdot\Delta t) \leqq 1/250$.

28. An image forming method as claimed in claim 24, wherein particles are exposed from the surface of the photoconductor.

29. An image forming method as claimed in claim 24, wherein said photoconductive layer comprises a charge transporting layer and wherein the particles have a refractive index which is 0.8 to 1.2 times that of the charge transporting layer.

30. An image forming method as claimed in claim 29, wherein the particles exposed from the surface of the photoconductor has a particle diameter in the range of 0.01–1.00 μm.

31. An image forming method as claimed in claim 24, wherein said photoconductive layer having a thickness of 15 μm or less.

32. An image forming method as claimed in claim 24, wherein said photoconductive layer has an interface on the side of said support, said interface having such characteristics as to provide I(S) of at least $1.5\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the interface and is $2^P$ where p is an integer, Δt is a sampling interval, in μm, at which the N-number of the samples are sampled, said sectional curve being obtained by measuring a profile of the interface through a preset length N·Δt, x(t) is a height of the sectional curve, in μm, of a sample at a position t in said preset length, and n and m are integers.

33. An image forming method as claimed in claim 32, wherein Δt ranges from 0.01 to 50.00 μm and N is at least 2048.

34. An image forming method as claimed in claim 24, wherein said support has a surface on which said photoconductive layer is provided, said surface of said support having such characteristics as to provide I(S) of at least $3.0\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of said support and is $2^P$ where p is an integer, Δt is a sampling interval, in μm, at which the N-number of the samples are sampled, said sectional curve being obtained by measuring a profile of the surface of said support through a preset length N·Δt, x(t) is a height of the sectional curve, in μm, of a sample at a position t in said preset length, and n and m are integers.

35. An image forming method as claimed in claim 34, wherein Δt ranges from 0.01 to 50.00 μm and N is at least 2048.

36. A photoconductor comprising a support, and a photoconductive layer provided on said support, said photoconductor having such surface characteristics as to provide I(S) of at least $3.0\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1}x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of the photoconductor and is $2^P$ where p is an integer, Δt is a sampling interval, in μm, at which the N-number of the samples are sampled, said sectional curve being obtained by measuring a profile of the surface through a preset length N·Δt, x(t) is a height of the sectional curve, in μm, of a sample at a position t in said preset length, and n and m are integers.

37. A process cartridge freely detachable from an image forming apparatus, comprising a photoconductor according to claim 36, and at least one means selected from the group consisting of charging means, image exposure means having a coherent light source, developing means, image transfer means, and cleaning means.

38. A method of producing a photoconductor comprising forming a photoconductive layer on a support such that said photoconductor has surface characteristics providing I(S) of at least $3.0\times10^{-3}$, wherein I(S) is given by the following equations:

$$I(S) = \left(\frac{1}{N}\right)\sum_{n=0}^{N-1}\left\{S\left(\frac{n}{N\cdot\Delta t}\right)\right\}$$

$$S\left(\frac{n}{N\cdot\Delta t}\right) = \frac{1}{N}\cdot\left|X\left(\frac{n}{N\cdot\Delta t}\right)\right|^2$$

$$X\left(\frac{n}{N\cdot\Delta t}\right) = \sum_{m=0}^{N-1} x(m\cdot\Delta t)\exp\left(-i2\pi\cdot\frac{n}{N\cdot\Delta t}\cdot m\cdot\Delta t\right)$$

wherein

N is a number of samples obtained from a sectional curve of the surface of the photoconductor and is $2^p$ where p is an integer, $\Delta t$ is a sampling interval, in $\mu$m, at which the N-number of the samples are sampled, said sectional curve being obtained by measuring a profile of the surface through a preset length $N\cdot\Delta t$, x(t) is a height of the sectional curve, in $\mu$m, of a sample at a position t in said preset length, and n and m are integers.

* * * * *